US008863808B2

(12) United States Patent
Yuki et al.

(10) Patent No.: US 8,863,808 B2
(45) Date of Patent: Oct. 21, 2014

(54) PAIR OF SUBSTRATE HOLDERS, SUBSTRATE HOLDER, SUBSTRATE BONDING APPARATUS AND METHOD FOR MANUFACTURING DEVICE

(75) Inventors: Daisuke Yuki, Yokohama (JP); Takahiro Miike, Yokohama (JP); Hiroshi Mori, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/524,820

(22) Filed: Jun. 15, 2012

(65) Prior Publication Data

US 2013/0008581 A1 Jan. 10, 2013

Related U.S. Application Data

(63) Continuation of application No. PCT/JP2010/007383, filed on Dec. 20, 2010.

(30) Foreign Application Priority Data

Dec. 18, 2009 (JP) ................................ 2009-288121
Dec. 18, 2009 (JP) ................................ 2009-288261

(51) Int. Cl.

| | |
|---|---|
| ***B32B 38/18*** | (2006.01) |
| ***H01L 21/18*** | (2006.01) |
| ***H01L 21/687*** | (2006.01) |
| ***H01L 21/67*** | (2006.01) |
| ***H01L 21/683*** | (2006.01) |

(52) U.S. Cl.
CPC ........ *H01L 21/68721* (2013.01); *H01L 21/187* (2013.01); *H01L 21/68728* (2013.01); *H01L 21/67092* (2013.01); *H01L 21/6833* (2013.01); *H01L 21/68764* (2013.01); *H01L 21/68785* (2013.01); *B32B 38/18* (2013.01)
USPC .............................. 156/580; 156/60; 438/455

(58) Field of Classification Search
CPC .... B32B 37/0046; B32B 38/18; B32B 43/00; H01L 21/187; H01L 21/6833; H01L 24/94; H01L 21/6883; H01L 21/68764; H01L 21/68785; H01L 21/68728; H01L 21/68721
USPC ............ 156/60, 580; 438/455, 456, 457, 458, 438/459
See application file for complete search history.

(56) References Cited

U.S. PATENT DOCUMENTS

2005/0158164 A1 7/2005 Lee
2010/0135764 A1* 6/2010 Wienrich et al. ......... 156/345.51

(Continued)

FOREIGN PATENT DOCUMENTS

JP 11-261000 9/1999
JP 2005-203727 7/2005

(Continued)

OTHER PUBLICATIONS

International Preliminary Report on Patentability from the International Bureau of WIPO in International Application No. PCT/JP2010/007383 mailed Jul. 19, 2012.

(Continued)

*Primary Examiner* — Philip Tucker
*Assistant Examiner* — John Blades
(74) *Attorney, Agent, or Firm* — Finnegan, Henderson, Farabow, Garrett & Dunner, LLP

(57) ABSTRACT

A substrate holder pair comprising a first substrate holder and a second substrate holder that holds a first substrate and a second substrate bonded to each other, between itself and the first substrate holder. The first substrate holder includes a pressure receiving portion that, when the first substrate holder is separated from the second substrate holder, is pressed by a pressing member, and the second substrate holder includes a passing portion through which passes the pressing member, to enable pressing of the pressure receiving portion by the pressing member.

31 Claims, 13 Drawing Sheets

(56) References Cited

U.S. PATENT DOCUMENTS

| | | | | |
|---|---|---|---|---|
| 2010/0206454 | A1 * | 8/2010 | Maeda et al. | 156/358 |
| 2011/0207291 | A1 * | 8/2011 | Tsuno et al. | 156/379.7 |

FOREIGN PATENT DOCUMENTS

| | | | | |
|---|---|---|---|---|
| JP | 2007-115978 | | 5/2007 | |
| JP | 2007-141924 | | 6/2007 | |
| JP | 2007-158199 | | 6/2007 | |
| JP | WO/2009/057710 | * | 5/2009 | H01L 21/02 |

OTHER PUBLICATIONS

International Search Report from the Japanese Patent Office in International Application No. PCT/JP2010/007383 mailed Mar. 29, 2011.

Written Opinion of the International Searching Authority from the International Searching Authority in International Application No. PCT/JP2010/007383 mailed Mar. 29, 2011.

* cited by examiner

PAIR OF SUBSTRATE HOLDERS, SUBSTRATE HOLDER, SUBSTRATE BONDING APPARATUS AND METHOD FOR MANUFACTURING DEVICE

BACKGROUND

1. Technical Field

The present invention relates to a pair of substrate holders, a device manufacturing method, a separating apparatus, a substrate separating method, a substrate holder, and a substrate aligning apparatus.

2. Background Art

As shown in Japanese Patent Application Publication No. H11-261000, a layered semiconductor device is manufactured by layering a variety of elements on a semiconductor substrate on which circuits or the like are formed. When forming the layers on the semiconductor substrate, a pair of semiconductor substrates held by a substrate holder are layered after the semiconductor circuits thereof are aligned with line-width precision, and then the substrates are bonded using thermocompression. At this time, as shown in Japanese Patent Application Publication No. 2007-115978, a thermocompression apparatus is used to achieve a permanent bond by thermocompressing the pair of semiconductor substrates.

When removing the substrates bonded by the thermocompression apparatus from the substrate holder, separation is difficult because portions of the substrate and substrate holder become stuck to each other due to melting or intake of dust that is unavoidably present between the substrate and the substrate holder. Therefore, a mechanism is desired that can appropriately separate the substrate from the substrate holder even when portions of the substrate and the substrate holder are stuck to each other.

SUMMARY

Therefore, it is an object of an aspect of the innovations herein to provide a substrate holder pair, a substrate holder, a substrate bonding apparatus, and a device manufacturing method, which are capable of overcoming the above drawbacks accompanying the related art. The above and other objects can be achieved by combinations described in the independent claims. According to a first aspect of the present invention, provided is a substrate holder pair comprising a first substrate holder; and a second substrate holder that holds a first substrate and a second substrate bonded to each other, between itself and the first substrate holder. The first substrate holder includes a pressure receiving portion that, when the first substrate holder is separated from the second substrate holder, is pressed by a pressing member, and the second substrate holder includes a passing portion through which passes the pressing member, to enable pressing of the pressure receiving portion by the pressing member.

According to a second aspect of the present invention, provided is a substrate holder pair comprising a first substrate holder; and a second substrate holder that holds a first substrate and a second substrate bonded to each other, between itself and the first substrate holder. At least one of the first substrate holder and the second substrate holder includes a holding section that exerts a holding force for holding one of the first substrate and the second substrate, the first substrate holder includes a pressure receiving portion that, when the first substrate holder is separated from the second substrate holder, receives a force in a direction causing movement away from the second substrate holder, and at least when the pressure receiving portion is receiving a force, the one substrate holder releases the hold on the one substrate.

According to a third aspect of the present invention, provided is a substrate holder that holds two layered substrates between itself and another substrate holder, the substrate holder comprising a passing section that, with the two substrates being held between the substrate holder and the other substrate holder, allows a pressing member to pass therethrough to enable pressing of the other substrate holder by the pressing member.

According to a fourth aspect of the present invention, provided is a substrate holder that holds two bonded substrates between itself and another substrate holder, the substrate holder comprising a pressure receiving portion that, when the substrate holder is separated from the other substrate holder, receives a force in a direction causing movement away from the other substrate holder. At least when the pressure receiving portion is receiving a force, the substrate holder releases the hold on the substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
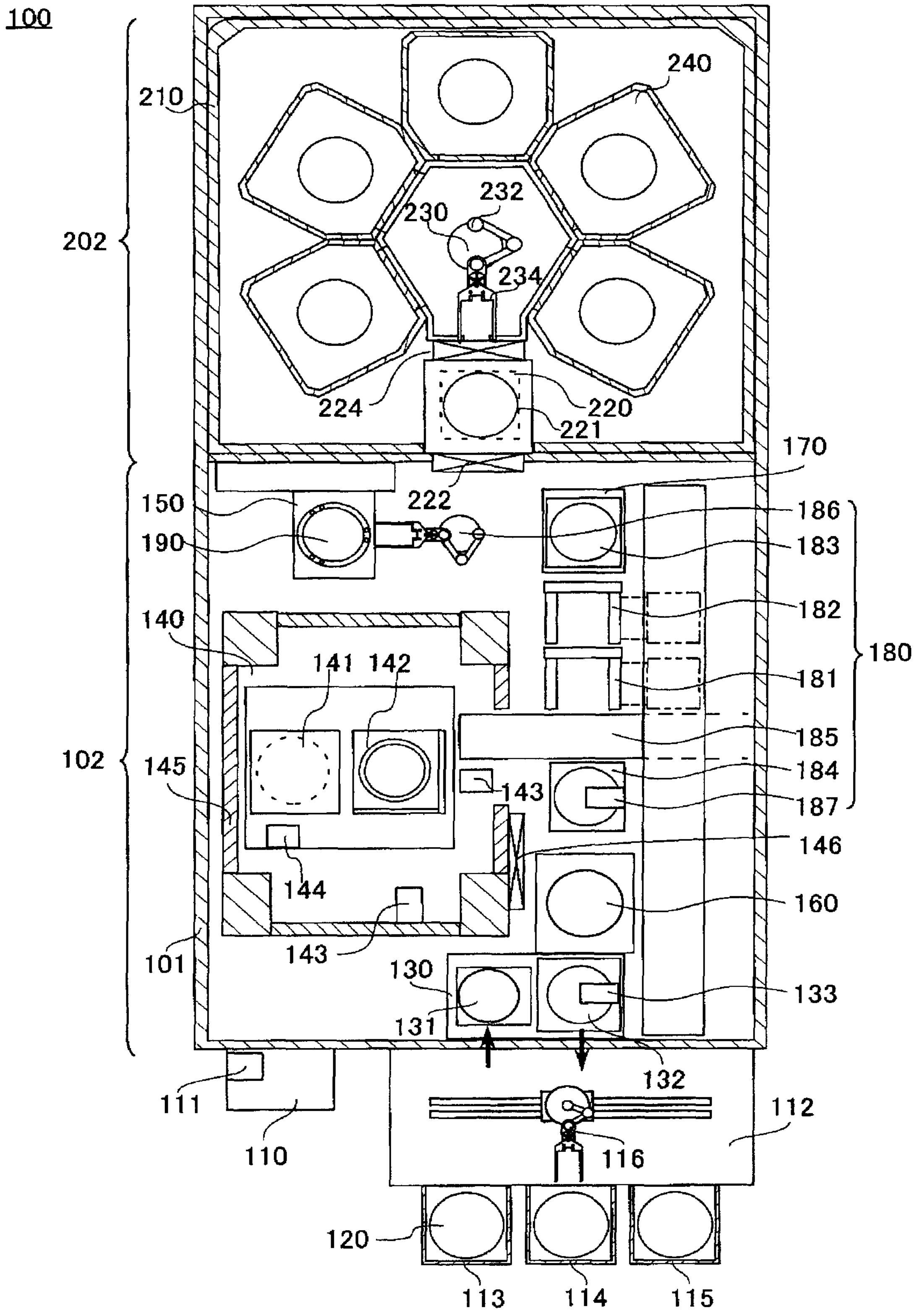
FIG. 1 is a planar view schematically showing an overall configuration of an aligning apparatus.

FIG. 1 is a planar view schematically showing an overall configuration of an aligning apparatus 100 that realizes the device manufacturing method according to the present embodiment. The aligning apparatus 100 bonds two substrates, on which are formed circuit patterns, by stacking the substrates such that the electrodes to be bonded are in contact with each other and then performing thermocompression. The aligning apparatus 100 includes an atmosphere environment section 102 and a vacuum environment section 202 formed in a shared case 101.

The atmosphere environment section 102 functions as an aligning apparatus that aligns the two substrates on which the circuit patterns are formed, such that the electrodes to be bonded are in contact with each other. The aligning apparatus 100 includes a control section 110 and an EFEM (Equipment Front End Module) 112 that face the outside of the case 101. Each apparatus and each component in the aligning apparatus 100 operates according to integrated control or cooperative control by control computing sections provided respectively to each component or a control section 110 that performs computations and control of the overall aligning apparatus 100. The control section 110 includes a storage section 111 that stores information for controlling the aligning apparatus 100, and an operating section that is operated from the outside by a user when turning the power on and off or performing a variety of settings for the aligning apparatus 100, for example. Furthermore, the control section 110 may include a connecting section for connecting to another provided device.

The EFEM 112 includes three loading ports 113, 114, and 115 and a robot arm 116. Each loading port is provided with a FOUP (Front Opening Unified Pod). The FOUPs are sealed substrate storage pods, and can each house a plurality of substrates 120.

The FOUPs provided to the loading ports 113 and 114 each house a plurality of substrates 120, which are transported to the atmosphere environment section 102 by the robot arm 116. With this configuration, the substrates 120 can be transported from the FOUPs to the atmosphere environment section 102 without contacting the external atmosphere, thereby preventing dust from becoming attached to the substrates 120. The substrates 120 bonded by the atmosphere environment section 102 and the vacuum environment section 202 are stored in the FOUP provided to the loading port 115.

The substrates 120 referred to here are compound semiconductor wafers or single-crystal silicon wafers on which a plurality of periodic circuit patterns are already formed, for example. The loaded substrates 120 may be layered substrates that have been formed by layering a plurality of wafers.

The atmosphere environment section 102 includes a preliminary aligner 130, a main aligner 140, a holder rack 150, an inverting mechanism 160, a separation mechanism 170, and a transport mechanism 180 that are arranged within the case 101. The temperature inside the case 101 is managed to be kept substantially the same as the room temperature of the environment in which the aligning apparatus 100 is located. As a result, the accuracy of the main aligner 140 is stabilized, thereby enabling accurate positioning.

The preliminary aligner 130 tentatively aligns the substrates 120 such that the substrates 120 are positioned with high accuracy within the narrow range of adjustment of the main aligner 140. Therefore, the positioning by the main aligner 140 can be reliably performed.

The preliminary aligner 130 includes a turntable 131, a hold table 132, and a detector 133. A substrate 120 is mounted on the turntable 131 by the robot arm 116 of the EFEM 112. The position of the substrate 120 in the rotational direction is adjusted by the turntable 131. A substrate holder 190 transported from the holder rack 150 is arranged on the holder table 132.

The detector 133 includes an image capturing section having an optical system that looks down on the substrate holder 190 mounted on the hold table 132 and the substrate 120 positioned above the substrate holder 190. The image capturing section is fixed to a location that is not easily affected by vibration, such as the ceiling frame of the preliminary aligner 130. Notches are formed in the outer circumference of the substrate holder 190, and the preliminary aligner 130 identifies the orientation of the substrate holder 190 by detecting the notches with the detector 133.

A plurality of insertion holes are formed in the substrate holding surface of the substrate holder 190, and these insertion holes penetrate from the front to back of the substrate holder 190. A plurality of penetration holes are formed in the hold table 132, and a plurality of lift pins pass through these penetration holes and the insertion holes of the substrate holder 190 to enable mounting of the substrate 120 on the lift pins.

Each substrate 120 transported from the turntable 131 to the hold table 132 by the substrate slider is mounted on a plurality of lift pins. An image of the substrate is then captured along with the substrate holder 190 by the image capturing section, and accurate alignment is achieved using the notch as a reference. After the alignment, the substrate 120 is held by the substrate holder 190. At this time, the preliminary aligner 130 stores in the storage section 111 the position information of the notch detected by the image capturing section.

A power supply pin is formed in the hold table 132, and is connected to a power supply terminal on the back surface of the substrate holder 190 to supply power to the substrate holder 190. The substrate holder 190 supplied with power from the power supply terminal electrostatically adheres the substrate 120 thereto, via a potential difference on the substrate holding surface of the substrate holder 190 caused by electrostatic chucks provided therein. The substrate 120 and substrate holder 190 formed integrally in this way are referred to as a "workpiece."

The main aligner 140 is an aligning mechanism that aligns two substrates 120 facing each other that have been held and transported by substrate holders 190. The main aligner 140 includes a fixed stage 141, a moving stage 142, an interferometer 143, and a control section 144. A heat insulating wall 145 and a shutter 146 are provided to surround the main aligner. The space surrounded by the heat insulating wall 145 and the shutter 146 is in communication with an air conditioner, for example, to be temperature-controlled, and maintains the alignment accuracy of the main aligner 140.

The fixed stage 141 is positioned above the moving stage 142, and holds the workpiece facing downward in a fixed state. The workpiece held by the fixed stage 141 is referred to as the "upper workpiece," and the substrate holder 190 forming the upper workpiece is referred to as the "upper substrate holder 191." The moving stage 142 transports the workpiece mounted thereon. The workpiece mounted on the moving stage 142 is referred to as the "lower workpiece," and the substrate holder 190 forming the lower workpiece is referred to as the "lower substrate holder 192." Detailed configurations of the upper substrate holder 191 and the lower substrate holder 192 are described further below.

The upper workpiece held by the fixed stage 141 and the lower workpiece held on the moving stage 142 are accurately aligned, under the control of the control section 144, such that the bonding surfaces thereof face each other, based on the position information stored in the storage section 111. The bonding surfaces are brought into contact and tentatively bonded with each other by raising the moving stage 142. The two tentatively bonded workpieces are referred to together as a "workpiece pair."

The holder rack 150 includes a plurality of ledges for storing the substrate holders 190. Each ledge includes, at least at three locations, support protrusions for holding the substrate holder 190. Each support protrusion is provided at a position corresponding to a peripheral region of the substrate holding surface of the substrate holder 190, and therefore the substrate holders 190 can be stored facing upward or facing downward. Here, the upper substrate holder 191 is stored such that the holding surface thereof holding the substrate 120 faces downward, and the lower substrate holder 192 is stored such that the holding surface thereof faces upward.

The inverting mechanism 160 includes a mechanism for inverting a substrate 120, substrate holder 190, or workpiece transported thereto by the transport mechanism 180. The configuration of the inverting mechanism 160 is described in detail further below.

The separation mechanism 170 removes the substrates 120 bonded and sandwiched between the substrate holders 190 from the workpiece pair after thermocompression is performed by the thermocompression apparatus 240, described further below. Here, when dust or the like is attached between a substrate 120 and a substrate holder 190 during the thermocompression, the dust can be sucked in or melted, which causes portions of the substrate 120 and the substrate holder 190 to stick to each other. During the removal, the substrate 120 is preferably separated fully from the substrate holder 190.

If the substrate 120 is firmly stuck to the substrate holder 190, excessive pulling can result in weakening of the adhesion of the substrate 120 or fractures in the substrate 120. Therefore, even when the substrate 120 is being separated from the substrate holder 190, it is preferable that a large stress not be placed on the substrate 120. A detailed configuration of the separation mechanism 170 is described further below.

The transport mechanism 180 includes a first transport unit 181, a second transport unit 182, a first handover port 183, a second handover port 184, a single slider 185, a robot arm 186, and an observing unit 187. The first transport unit 181 and the second transport unit 182 transport the substrates 120, the substrate holders 190, the workpieces, and the workpiece pairs between the preliminary aligner 130, the inverting mechanism 160, the first handover port 183, and the second handover port 184.

The first transport unit 181 and the second transport unit 182 run independently on respective rails that run in parallel in a vertical direction. The first transport unit 181 is arranged above the second transport unit 182 so that these transport units can pass by each other while holding substrates 120, substrate holders 190, workpieces, or workpiece pairs.

The first handover port 183 is provided on top of the separation mechanism 170, and includes a push-up pin for mounting the substrate holders 190 and workpiece pairs thereon. The second handover port 184 also includes a push-up pin, and serves as an intermediary when passing the substrate holders 190, the workpieces, and the workpiece pairs between the single slider 185, the first transport unit 181, and the second transport unit.

The single slider 185 transports the workpieces and workpiece pairs between the second handover port 184 and the main aligner 140. The robot arm 186 transports the workpiece pairs between the first handover port 183, the separation mechanism 170, and the load-lock chamber 220 described further below. The robot arm 186 transports the substrate holders 190 between the holder rack 150, the first handover port 183, and the separation mechanism 170.

The observing unit 187 is formed by an image capturing section positioned above the second handover port 184, and observes the notch of the substrate holder 190 during transport. The workpieces transported from the preliminary aligner 130 have already been aligned by the preliminary aligner 130, but there is a chance that this alignment will be skewed as a result of the handling by the inverting mechanism 160 and the transport mechanism 180. In such a case, the position information of the notch stored in the storage section 111 differs from the actual position of the notch, and therefore, the alignment accuracy of the main aligner 140 drops.

In the present embodiment, the control section 144 of the main aligner 140 determines the skew between the position of the notch of the preliminary aligner 130 stored in the storage section 111 and the position of the notch observed by the observing unit 187, and stacks the substrates 120 after correcting this skew. With this configuration, the problem of skew caused by the inverting mechanism 160 and the transport mechanism 180 can be solved, and the stacking can be performed with high precision.

The image capturing section of the observing unit 187 described above captures an image of the notches of the substrate holders 190 in order to detect skew of the substrate holders 190 during transport. Here, the substrate holders 190 are aligned by the preliminary aligner 130 and do not have a large skew, and therefore the image capturing field of vision of the image capturing section of the observing unit 187 can be narrower than the image capturing field of the image capturing section of the preliminary aligner 130.

The above describes one example in which the observing unit 187 is arranged above the second handover port 184, but the configuration is not limited to this. The objective is to detect skew occurring between the preliminary alignment and the tentative bonding, and therefore the observing unit 187 may be arranged at any position on the path from the preliminary aligner 130 to the main aligner 140. In particular, since there is a chance that skew will occur due to the inversion by the inverting mechanism 160, the observing unit 187 is preferably provided between the inverting mechanism 160 and the main aligner 140.

The vacuum environment section 202 includes a heat insulating wall 210, a load-lock chamber 220, a robot arm 230, and a plurality of thermocompression apparatuses 240. The heat insulating wall 210 surrounds the vacuum environment section 202 to maintain the internal temperature of the vacuum environment section 202 and block thermal radiation from escaping outside the vacuum environment section 202. In this way, the effect of the heat of the vacuum environment section 202 on the atmosphere environment section 102 can be restricted.

The robot arm 230 is a transport apparatus that transports workpiece pairs, and includes a robot arm control unit 232 controlling movement of the robot arm 230 and a holding member 234 holding the workpiece pairs. The held workpiece pairs are transported between the load-lock chamber 220 and the thermocompression apparatus 240.

The load-lock chamber 220 includes shutters 222 and 224, provided respectively on the atmosphere environment section 102 side and the vacuum environment section 202 side, that open and close in an alternating manner. When a workpiece pair is transported into the vacuum environment section 202 from the atmosphere environment section 102, first, the shutter 222 on the atmosphere environment section 102 side opens, and the robot arm 186 transports the workpiece pair into the load-lock chamber 220. Next, the shutter 222 on the atmosphere environment section 102 side is closed and the atmosphere in the load-lock chamber 220 is expelled, thereby creating a vacuum state.

A heater 221 is provided in the load-lock chamber 220, and the workpiece pair transported into the load-lock chamber 220 is heated in advance by the heater 221 before undergoing thermocompression by the thermocompression apparatus 240. In other words, the time during which the atmosphere in the load-lock chamber 220 is exchanged is used to heat the workpiece a certain amount prior to being transported into the thermocompression apparatus 240, thereby improving the throughput of the thermocompression apparatus 240. The heating within the load-lock chamber 220 is preferably performed after the workpiece pair is transported into the load-lock chamber 220. As a result, the time that the workpiece pair spends within the load-lock chamber 220 can be decreased.

After the vacuum state is achieved in the load-lock chamber 220, the shutter 224 on the vacuum environment section 202 side is opened, and the workpiece pair is transported out by the robot arm 230. With this type of transport into the vacuum environment section 202, the workpiece pair can be transported into the vacuum environment section 202 without the internal atmosphere of the atmosphere environment section 102 leaking out the vacuum environment section 202 side.

Next, the robot arm 230 transports the workpiece pair into one of the plurality of thermocompression apparatuses 240. The thermocompression apparatus 240 then performs thermocompression on the workpiece pair. In this way, the substrates 120 transported while sandwiched by the substrate holders 190 can be permanently bonded.

Each thermocompression apparatus 240 includes a main body for heating the workpiece pair and a thermocompression chamber in which the main body is arranged. The robot arm 230 is arranged in a robot arm chamber. In other words, the load-lock chamber 220, the robot arm, and the plurality of thermocompression chambers forming the vacuum environment section 202 are each segregated and the atmospheres therein can each be adjusted independently. Furthermore, as shown in FIG. 1, in the vacuum environment section 202, the thermocompression chambers and the load-lock chamber 220 are arranged in a circular pattern centered around the robot arm chamber.

When a workpiece pair is transported from the vacuum environment section 202 to the atmosphere environment section 102, first, the shutter 224 on the vacuum environment section 202 side is opened and the robot arm 230 transports the workpiece pair into the load-lock chamber 220. Next, the shutter 224 on the vacuum environment section 202 side is closed, and the shutter 222 on the atmosphere environment section 102 side is opened.

Each thermocompression apparatus 240 may include a cooling section for cooling the workpiece pair after the thermocompression. In this way, the thermal radiation from a workpiece pair returned to the atmosphere environment section 102 after heating is restricted, and the temperature of the atmosphere environment section 102 can be easily managed. Furthermore, one of the thermocompression apparatuses 240 can be replaced with a cooling apparatus. In this case, a cooling chamber in which the cooling apparatus is provided is arranged on the periphery of the robot arm chamber. The workpiece pair heated by the thermocompression apparatus 240 is inserted into the cooling apparatus, and the cooling apparatus cools the workpiece pair to a prescribed temperature. The cooling chamber of the cooling apparatus is preferably cooled in advance prior to the heated workpiece pair being transported thereto.

The following is a basic description of the flow up to the point where two substrates 120 are stacked and integrated. First, the flow up to the point where the upper workpiece is formed and transported into the main aligner 140 will be described. When the aligning apparatus 100 begins to operate, the robot arm 186 transports a stored upper substrate holder 191 whose mounting surface faces downward from the holder rack 150, and mounts the upper substrate holder 191 on the push-up pin of the first handover port 183.

Next, the second transport unit 182 holds the upper substrate holder 191 mounted on the push-up pin of the first handover port 183, and moves to be above the inverting mechanism 160. The inverting mechanism 160 holds the upper substrate holder 191 via the support pins 161, and the second transport unit 182 withdraws. The inverting mechanism 160 then inverts the upper substrate holder 191 and mounts the inverted upper substrate holder 191 on the support pins. The first transport unit 181 holds the inverted upper substrate holder 191 via the support pins, and moves to be above the hold table 132 of the preliminary aligner 130. The upper substrate holder 191 is then mounted on the hold table 132.

The substrate 120 to be held by the upper substrate holder 191 is transported from the FOUP by the robot arm 116 of the EFEM 112, and is mounted on the turntable 131 of the preliminary aligner 130. After being aligned in a rotational direction by the turntable 131, the substrate 120 is held by the substrate slider and moved to the hold table 132.

The upper substrate holder 191 and the substrate 120 are aligned with high precision, using the notch of the upper substrate holder 191 detected by the detector 133 as a reference, and the substrate 120 is mounted on the upper substrate holder 191. At this time, the position information indicating the position of the notch of the upper substrate holder 191 is stored in the storage section 111.

Power is supplied to the upper substrate holder 191 by the hold table 132, and the substrate 120 is fixed to the upper substrate holder 191 by electrostatic adhesion. The workpiece formed in this manner is transported to be directly above the inverting mechanism 160 by the first transport unit 181. The inverting mechanism 160 inverts the upper workpiece and mounts the workpiece on the support pins with the substrate holding surface facing downward. The first transport unit 181 then moves the upper workpiece mounted on the support pins to the second handover port 184.

The second handover port 184 holds the upper workpiece by extending the push-up pin, and the first transport unit 181 withdraws. Next, the single slider 185 holds the upper workpiece and transports the upper workpiece into the main aligner 140. The workpiece transported into the main aligner 140 is tentatively placed on the push-up pin protruding from the moving stage 142. During this transport, the upper workpiece is observed by the observing unit 187, and the position information indicating the position of the notch of the upper substrate holder 191 forming the upper workpiece is stored in the storage section 111.

Based on the position of the notch 913 observed by the observing unit 187 and the position of the notch 913 in the preliminary aligner 130, the skew that occurred during the transportation from the preliminary aligner 130 to the main aligner 140 is determined, and information indicating this skew is stored in the storage section 111. The control section 110 references the skew information of the upper substrate holder 191 stored in the storage section 111, and corrects the target position of the upper workpiece mounted on the fixed stage 141.

The main aligner 140 moves the moving stage 142 to the target position with a high degree of precision, while using the interferometer 143 to observe this position. As a result of this movement, the moving stage 142 is moved to a position directly below the fixed stage 141. The upper workpiece is then lifted toward the fixed stage side and pressed against the fixed stage 141. The upper workpiece is fixed to the fixed stage 141 by vacuum suction.

The following describes the flow of forming the lower workpiece, transporting the lower workpiece into the main aligner 140, and tentatively bonding the lower workpiece with the upper workpiece to form a workpiece pair. First, the robot arm 186 transports the lower substrate holder 192, which is stored with the substrate holding surface thereof facing upward, from the holder rack 150, and mounts the lower substrate holder 192 on the push-up pin of the first handover port 183. The lower substrate holder 192 is transported by the second transport unit 182 to be above the hold table 132 of the preliminary aligner 130, and is mounted on the hold table 132 by the preliminary aligner 130.

The substrate 120 to be mounted on the lower substrate holder 192 is transported from a FOUP by the robot arm 116 of the EFEM 112, and mounted on the turntable 131 of the preliminary aligner 130. After being positioned in the rotational direction by the turntable 131, the substrate 120 is held by the substrate slider and moved to the hold table 132.

The substrate 120 and the lower substrate holder 192 are aligned with high precision, using the notch of the lower substrate holder 192 detected by the detector 133 as a reference, and the substrate 120 is mounted on the lower substrate holder 192. At this time, the position information indicating the position of the notch of the lower substrate holder 192 is stored in the storage section 111. Power is supplied to the lower substrate holder 192 by the hold table 132, and the substrate 120 is fixed to the lower substrate holder 192 by electrostatic adhesion.

The lower workpiece formed in this way is moved to the second handover port 184 by the second transport unit 182. The second handover port 184 holds the lower workpiece by extending the push-up pin, and the first transport unit 181 withdraws. Next, the single slider 185 holds the lower workpiece, and transports the lower workpiece into the main aligner 140. The lower workpiece transported into the main aligner 140 is tentatively placed on the push-up pin protruding from the moving stage 142. During transportation, the lower workpiece observed by the observing unit 187, and the position information indicating the position of the notch of the lower substrate holder 192 forming the lower workpiece is stored in the storage section 111.

Based on the position of the notch 913 observed by the observing unit 187 and the position of the notch 913 in the preliminary aligner 130, the skew that occurred during the transportation from the preliminary aligner 130 to the main aligner 140 is determined, and information indicating this skew is stored in the storage section 111. The control section 110 references the skew information of the upper substrate holder 191 and the skew information of the lower substrate holder 192 stored in the storage section 111, and corrects the target position of the lower workpiece mounted on the moving stage 142. Instead of the control section 110, this operation may be performed by a control section included in the main aligner 140.

The main aligner 140 moves the moving stage 142 to the target position with a high degree of precision, while using the interferometer 143 to observe this position. When the alignment is finished, the moving stage 142 is moved toward the fixed stage 141, thereby achieving tentative bonding by bringing the bonding surfaces into contact with each other. The tentative bonding is realized by operating adhesion mechanisms provided respectively to two substrate holders 190 facing each other to achieve integration. The workpiece pair is formed in this manner. In this way, the main aligner 140 causes the upper substrate holder 191 inverted by the inverting mechanism 160 and the lower substrate holder 192 transported thereto without being acted upon by the inverting mechanism 160 to face each other, and stacks these substrate holders.

The following describes a flow of transporting the tentatively bonded workpiece pair into the vacuum environment section 202, bonding the two substrates 120, and transporting the resulting workpiece pair into the FOUP provided to the loading port 115. The tentatively bonded and integrated workpiece pair is mounted on the push-up pin of the second handover port 184 by the single slider 185. The second transport unit 182 transports the workpiece pair into the first handover port 183, and mounts the workpiece pair on the push-up pin of the first handover port 183. Next, the robot arm 186 holds the workpiece pair on the first handover port 183 and transports the workpiece pair into the load-lock chamber 220.

After preliminary heating using the heater 221 of the load-lock chamber 220, the workpiece pair is transported into the thermocompression apparatus 240 by the robot arm 230. The workpiece pair then undergoes thermocompression in the thermocompression apparatus 240, thereby permanently bonding the two substrates 120 to each other in an integrated manner.

After bonding, the workpiece pair is transported from the thermocompression apparatus 240 to the load-lock chamber 220 by the robot arm 230. The robot arm 186 then transports the workpiece pair from the load-lock chamber 220 to the separation mechanism 170. The bonded substrate 120 is separated from the upper substrate holder 191 and the lower substrate holder 192 by the separation mechanism 170.

The separated upper substrate holder 191 is mounted on the push-up pin of the first handover port 183 by the robot arm 186. This upper substrate holder 191 is held by the first transport unit 181 and transported to the inverting mechanism 160. The upper substrate holder 191 is inverted by the inverting mechanism 160 and transported to the hold table 132 of the preliminary aligner 130 by the first transport unit 181. The upper substrate holder 191 is then mounted on the hold table by the preliminary aligner 130, and remains there until the next substrate 120 is to be held. Instead of the first handover port 183, the robot arm 186 may return the upper substrate holder 191 transported from the separation mechanism 170 to the holder rack 150.

After bonding, the lower substrate holder 192 with the substrate 120 mounted thereon is mounted on the push-up pin of the first handover port 183 by the robot arm 186. The second transport unit 182 holds the lower substrate holder 192 and the bonded substrates 120, and moves the lower substrate holder 192 and the substrates 120 to the hold table 132 of the preliminary aligner 130. Next, the robot arm 116 of the EFEM 112 holds the bonded substrates 120 and transports the bonded substrates 120 into the FOUP provided to the loading port 115. The lower substrate holder 192 mounted on the hold table 132 stands by until the next substrate 120 is to be held.

Figure 2:
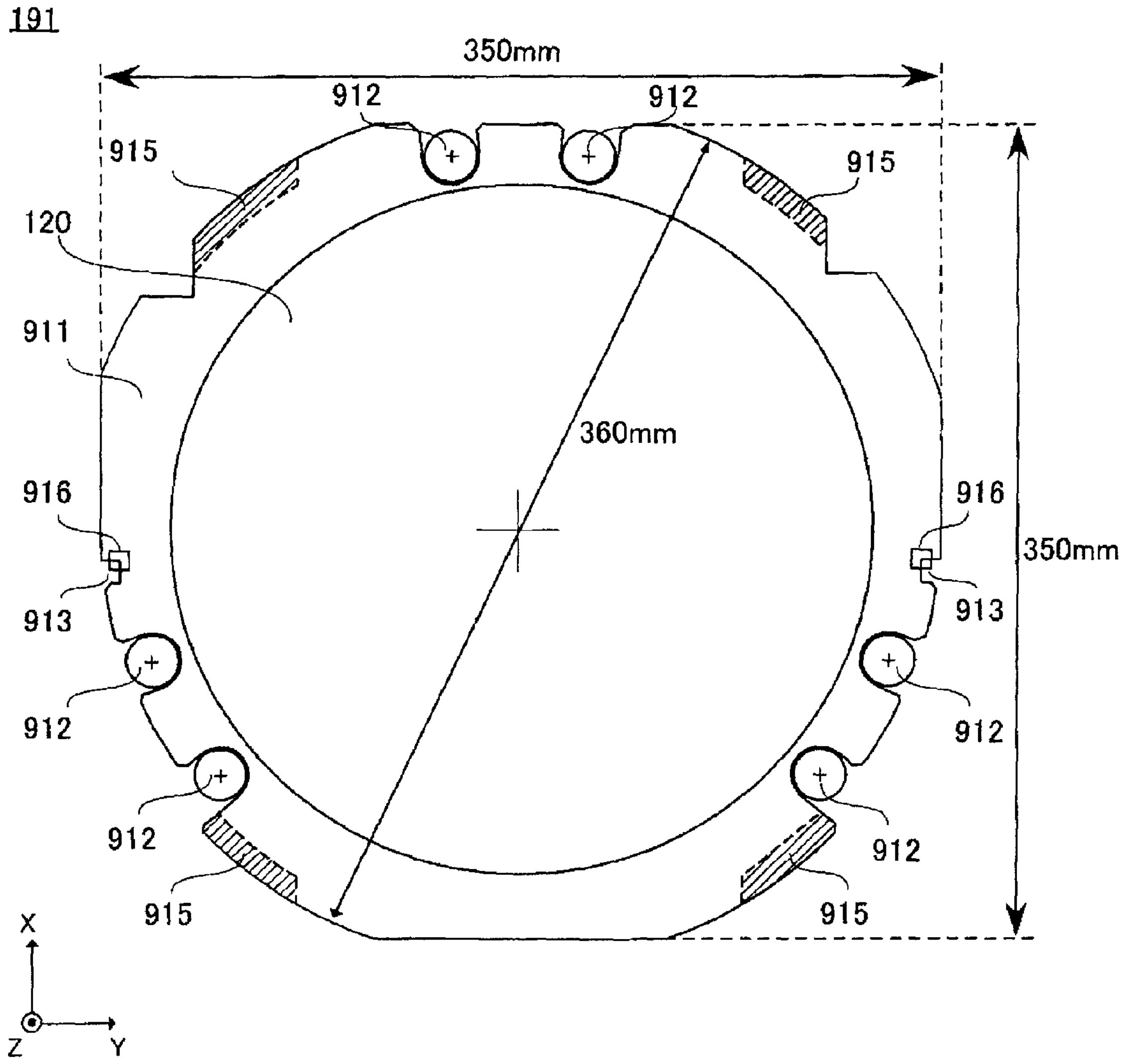
FIG. 2 is a planar view schematically showing a configuration of an upper substrate holder.

FIG. 2 is a planar view schematically showing an upper substrate holder 191 holding a substrate 120. The upper substrate holder 191 includes a holder body 911 and a magnet unit 912, and has an overall circular board shape with a diameter larger than that of the substrate 120. The holder body 911 is formed as a single body, from a highly rigid material such as ceramic or metal.

The holder body 911 includes a region for holding the substrate 120 on the surface thereof. This holding region is polished to have a high degree of flatness. The holding of the substrate 120 is realized by adhesion using electrostatic force. Specifically, voltage is applied to an electrostatic chuck embedded in the holder body 911 via a voltage application terminal provided in the back surface of the holder body 911, thereby creating a potential difference between the upper substrate holder 191 and the substrate 120 to adhere the substrate 120 to the upper substrate holder 191. The adhesion surface of the substrate 120 is the surface opposite the surface on which the circuit region is formed.

The holder body 911 includes a notch 913 in a portion of the outer circumference thereof. The notch 913 is used by the preliminary aligner 130 as a reference during the preliminary alignment of the substrate 120 on the substrate holder 190. Furthermore, the notch 913 is used to check positional skew occurring during transport of the substrate holder 190. Specifically, the main aligner 140 determines the skew by comparing the position of the notch 913 in the preliminary aligner 130 stored in the storage section 111 and the position of the notch 913 observed by the observing unit 187. The notch 913 is formed to have right angles at the corners along the X and Y directions, and the preliminary aligner 130 and observing unit 187 observe the notch 913 in a manner to include at least these right angle portions in the observation.

When the preliminary aligner 130 captures an image, there is a chance that the notch 913 could be skewed by a large amount, and therefore the image capturing field of vision must be wide enough to compensate for this skew. In contrast, the image capturing field of vision of the image capturing section of the observing unit 187 may be large enough to correspond to the notch 913 portion, as shown by the image capturing field of vision 916, and can therefore be narrower than the image capturing field of vision of the image capturing section of the preliminary aligner 130.

The notch 913 is observed by the observing unit 187 in this way, but when the notch 913 is thick, there are cases where the angle of the observing unit 187 prevents accurate detection of the edge. Therefore, in the present embodiment, the notch 913 is formed to have a pointed tapered tip. With this structure, the detection accuracy of the edge can be increased, and the effect of the angle of the observing unit 187 can be decreased.

Forming the tip of the notch 913 to be tapered with an inclination toward the back surface or the substrate holding surface of the substrate holder 190 is sufficient for increasing the accuracy of the edge detection. However, in the upper substrate holder 191, the notch 913 is observed from the substrate holding surface side when observed by the preliminary aligner 130, and is observed from the back side when observed by the observing unit 187. In this case, the distance between the notch 913 and the observing unit 187 changes, and therefore there is a chance of a measurement error occurring. Therefore, instead of being formed as an inclined taper, the notch 913 is preferably formed such that there is no inclination and the tip comes to the center of the substrate holder 190 in the thickness direction.

If the tip of the notch 913 is formed as a thin board, for example, instead of the tapered form, such that the tip of the notch 913 is machined to be thinner than the substrate holder 190, the remaining form of the notch 913 is not particularly important. Furthermore, one notch 913 may be provided, but it is preferable for two or more notches 913 to be provided in order to measure the rotation around the center of the substrate holder 190. In this case, a plurality of observing units 187 corresponding to the number of notches are provided, and the observation results of the plurality of observing units 187 can be used to detect the rotational skew around the center of the substrate holder 190.

The notches 913 are preferably provided at positions as far from the center of the substrate holder 190 as possible. The further from the center of the substrate holder 190 the notches 913 are positioned, the greater the decrease in the measurement error of the rotation around the center of the substrate holder 190, and if the notches 913 are provided at the furthest position from the center, the rotation measurement error can be minimized.

Furthermore, each notch 913 is preferably formed to have a right angle at corners along the X and Y directions. With this configuration, the X-direction component and Y-direction component in the measurement field of vision of the observing unit 187 can be easily identified. Furthermore, if the corner portions, which are the right angle portions connecting the X and Y directions, are rounded, the linear portions that can be observed in the measurement field of vision of the observing unit 187 are preferably long enough to enable easy identification of the X-direction component and Y-direction component.

A plurality of magnet units 912 are arranged along the outer circumference of the surface holding the substrate 120, which is a region further outward than the substrate 120 being held. In FIG. 2, sets that each include two magnet units 912 are arranged at 120 degree intervals, for a total of six magnet units 912.

The upper substrate holder 191 includes a flange portion 915, which is a portion that does not match the outer circumference of the lower substrate holder 192, in the outer circumference thereof. The area of the projected shape of the outer circumference of the upper substrate holder 191, i.e. the area of the shape projected by the upper substrate holder 191 on the X-Y plane, is larger than the area of the projected shape of the outer circumference of the lower substrate holder 192, by the area of the flange portion 915. The flange portion 915 is formed such that the projected shapes of the upper substrate holder 191 and the lower substrate holder 192, in whichever of the X-direction and the Y-direction the upper substrate holder 191 and the lower substrate holder 192 progress in, are the same.

When the separation mechanism 170 separates the bonded substrates 120 from the lower substrate holder 192, the upper substrate holder 191 receives a pressing force from the lower substrate holder 192 side in a region thereof including the flange portion 915. At this time, the electrostatic adhesion of the upper substrate holder 191 is activated and the electrostatic adhesion of the lower substrate holder 192 is deactivated, and therefore the substrates 120 are lifted up together with the upper substrate holder 191 and separated from the lower substrate holder 192. A specific description of the configuration for separating the substrates 120 from the substrate holder 190 is provided further below.

The substrate holder 190 is transported onto the transport mechanism 180 while holding the substrates 120, or transported into the thermocompression apparatus 240 and the load-lock chamber 220. Here, in order to conserve the overall space in the aligning apparatus 100, the transport mechanism 180, the load-lock chamber 220, and the thermocompression apparatus 240 are preferably made smaller. In particular, the load-lock chamber 220 includes a mechanism for creating a vacuum therein, and the vacuum state can be created more quickly if the load-lock chamber 220 is smaller. Therefore, a smaller size is also preferably when considering throughput.

The sizes of these apparatuses depend on the size of the substrate holders 190, and therefore the substrate holders 190 are preferably small. However, since each substrate holder 190 includes a region for holding a substrate 120 and a mechanism for tentative bonding, such as a magnet unit 912, there is a limit to how small the substrate holder 190 can be.

In the present embodiment, the edge of the substrate holder 190, which forms an approximate circle, is cut away in various locations. As shown in FIG. 2, the upper substrate holder 191 is cut away in the X-axis direction and Y-axis direction at the edges thereof, such that the length of the diameter is different depending on the location. In the example of FIG. 2, the portion with the greatest length in the direction of the diameter has a length of 360 mm, while the length in the diameter direction along the X-axis and Y-axis is 350 mm.

With this shape, the transport mechanism 180, the load-lock chamber 220, and the thermocompression apparatus 240 can be designed with a smaller shape, by controlling the transport in the X-axis direction and Y-axis direction during transport to the load-lock chamber 220 or the like. Therefore, space can be conserved in the overall aligning apparatus 100, and the throughput can be improved due to the decrease in the time needed to create the vacuum state in the load-lock chamber 220.

Figure 3:
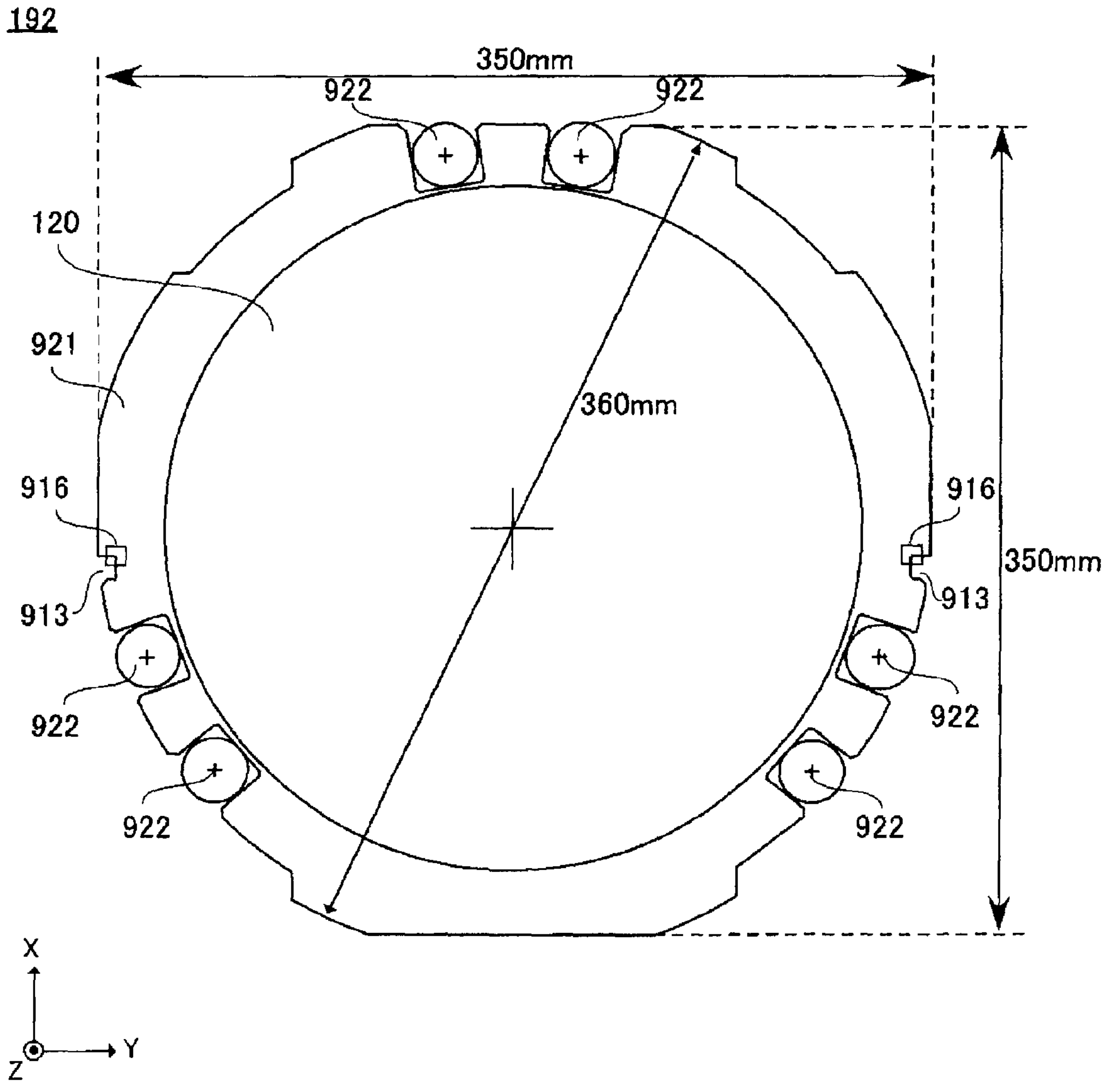
FIG. 3 is a planar view schematically showing a configuration of a lower substrate holder.

FIG. 3 is a planar view schematically showing a lower substrate holder 192 holding a substrate 120. The lower substrate holder 192 includes a holder body 921 and an adhering unit 922, and has an overall circular board shape with a diameter larger than that of the substrate 120. The holder body 921 is formed as a single body, from a highly rigid material such as ceramic or metal.

The holder body 921 includes a region for holding the substrate 120 on the surface thereof. This holding region is polished to have a high degree of flatness. The holding of the substrate 120 is realized by adhesion using electrostatic force. Specifically, voltage is applied to an electrostatic chuck embedded in the holder body 921 via a voltage application terminal provided in the back surface of the holder body 921, thereby creating a potential difference between the lower substrate holder 192 and the substrate 120 to adhere the substrate 120 to the lower substrate holder 192. The adhesion surface of the substrate 120 is the surface opposite the surface on which the circuit region is formed.

In the same manner as the upper substrate holder 191, the lower substrate holder 192 is formed to have portions thereof cut away in the X-axis direction and the Y-axis direction, and therefore edges of the formed workpiece pair are also cut away in the X-axis direction and the Y-axis direction.

A plurality of adhering units 922 are arranged along the outer circumference of the surface holding the substrate 120, which is a region further outward than the substrate 120 being held. In FIG. 3, sets that each include two adhering units 922 are arranged at 120 degree intervals, for a total of six adhering units 922.

The adhering units 922 are formed by magnetic bodies, such as iron, and are arranged to correspond respectively to the magnet units 912 of the upper substrate holder 191. When the upper substrate holder 191 holding a substrate 120 and the lower substrate holder 192 holding a substrate 120 face each other and the adhering units 922 and magnet units 912 are operated, the upper substrate holder 191 and lower substrate holder 192 can be fixed while sandwiching the two substrates 120 in a stacked state.

Figure 4:
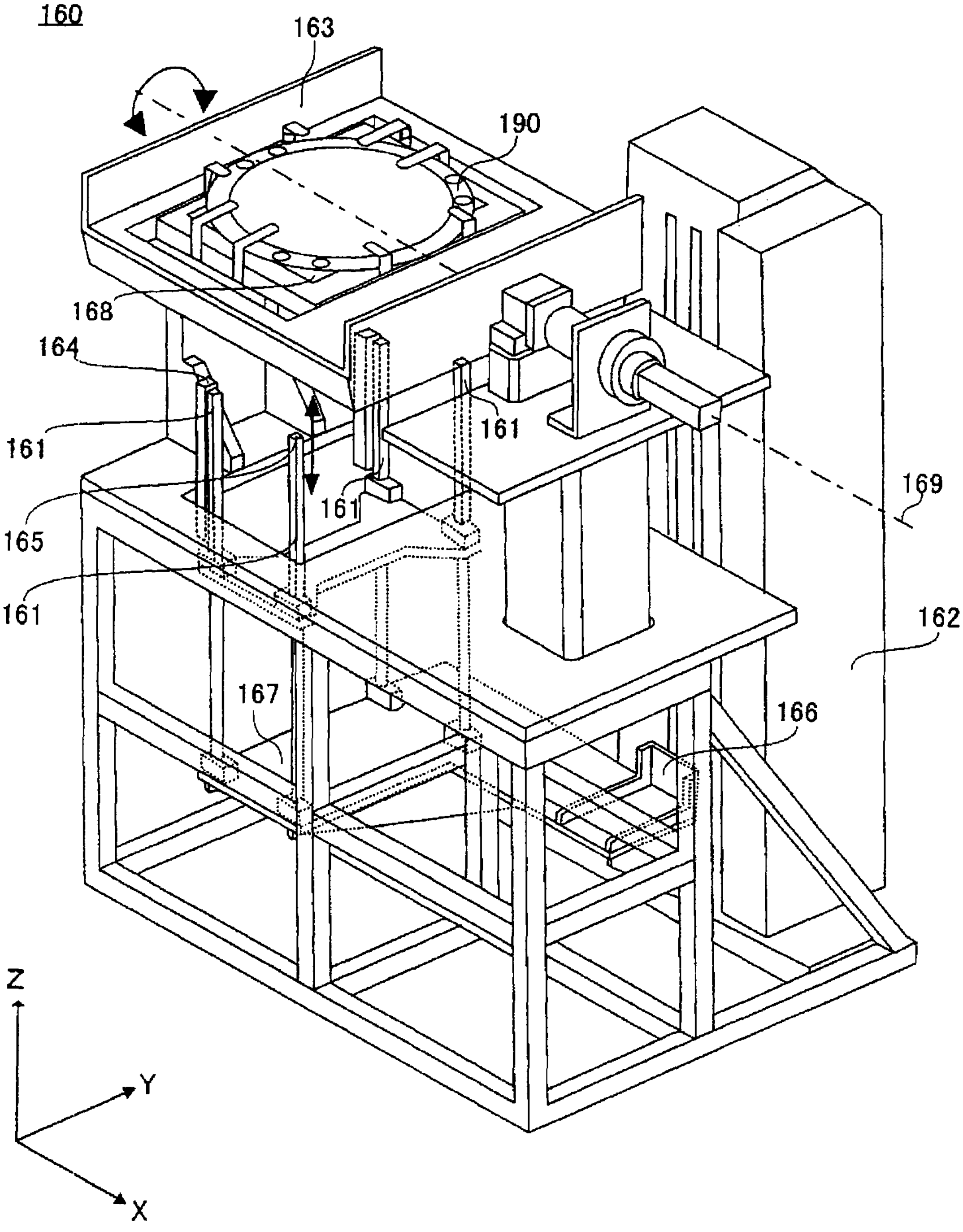
FIG. 4 is a perspective view schematically showing a configuration of an inverting mechanism.

FIG. 4 is a perspective view schematically showing the inverting mechanism 160. The inverting mechanism 160 is arranged below the second transport unit 182, and is directly below the second transport unit 182 when the second transport unit 182 moves to the inverting mechanism 160. The inverting mechanism 160 can invert a substrate 120, a substrate holder 190, and a workpiece, and the following describes an example in which a workpiece is inverted. The inverting mechanism 160 includes a plurality of support pins 161 that receive the workpiece from the transport mechanism 180, a Z-driving section 162 that drives the support pins 161 up and down, and a rotational support member 163 that rotates while holding the workpiece.

The Z-driving section 162 includes a mechanical section 166 and a bottom plate 167. The mechanical section 166 is a mechanism that performs driving with a ball screw and a linear guide, and moves the bottom plate 167 in a direction of the Z-axis. The present embodiment includes four support pins 161, and each support pin 161 is arranged on the bottom plate 167. In other words, the support pins 161 move in the Z-axis direction according to the Z-driving section 162.

Each support pin 161 includes a gap sensor 165 and a power supply pin 164 on the tip thereof. The power supply pin 164 is connected to the power supply terminal of the workpiece provided on the substrate holder 190 forming the workpiece, and supplies power to the substrate holder 190 to fix the workpiece using electrostatic adhesion. The gap sensor 165 detects the horizontalness of the workpiece held by the support pin 161. The horizontalness can be expressed as 0 when the workpiece is horizontal, and the absolute value of the horizontalness increases as the inclination increases. Each of the four support pins 161 includes a gap sensor 165.

The four support pins 161 raised by the Z-driving section 162 penetrate through respective gaps 168 of a rotational support member 163, to raise the workpiece held by the first transport unit 181 or the second transport unit 182. In FIG. 4, only one region is indicated as the gap 168, but there are four gaps 168 that are directly above the four support pins 161. After the first transport unit 181 or the second transport unit 182 has withdrawn, the workpiece is lowered to the position of the rotational support member 163 by lowering the support pins 161.

The rotational support member 163 grasps the workpiece and inverts the workpiece with a centerline 169 as a rotational axis. The centerline 169 matches the centerline of the bonding surface of the substrates 120 forming the workpiece. By inverting the workpiece with the centerline 169 as the rotational axis, the surfaces of the substrates 120 can be kept at the same position in the Z-axis direction before and after the inversion.

Figure 5:
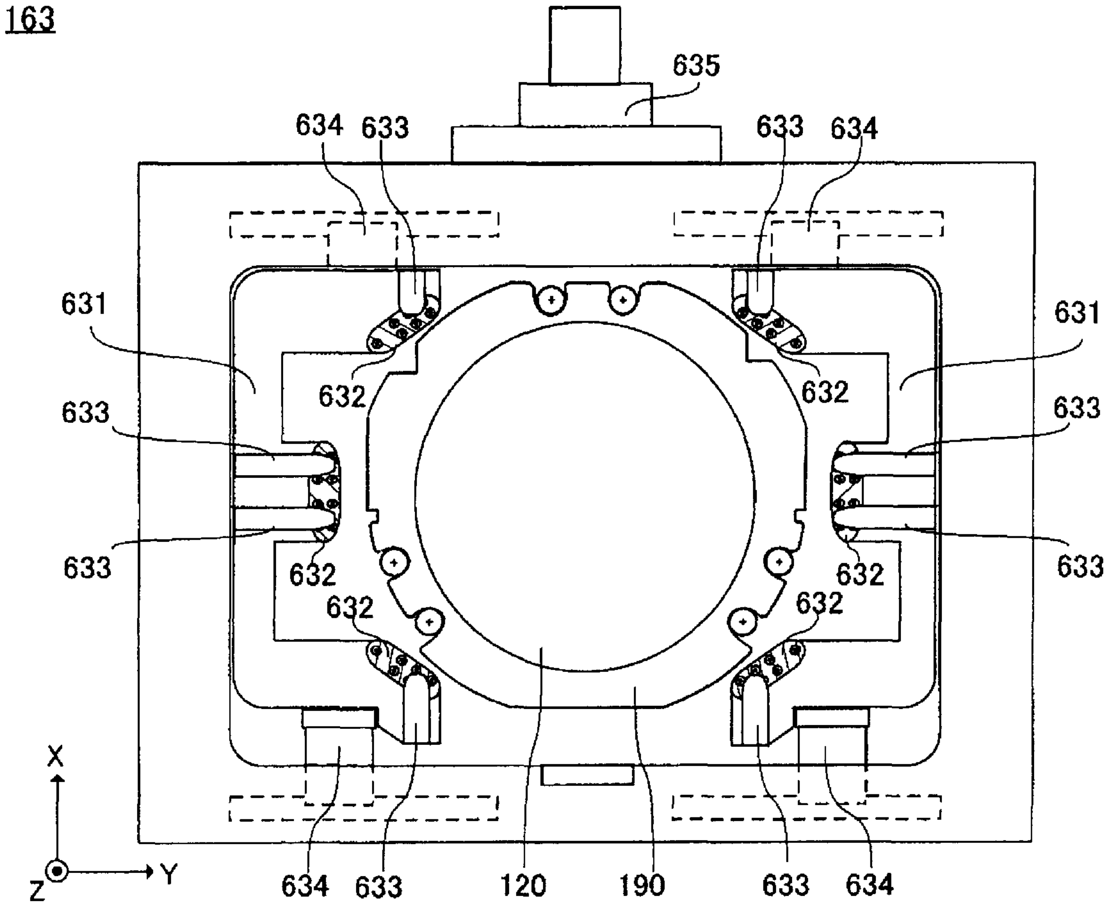
FIG. 5 is a planar view schematically showing a configuration of a rotational support member.

FIG. 5 is a planar view schematically showing the configuration of the rotational support member 163. The rotational support member 163 includes a hand portion 631 and a hand opening/closing unit 634. The hand portion 631 includes an adhering section 632 and a claw portion 633. The adhering section 632 fixes thereto the workpiece mounted thereon, using vacuum suction. The claw portion 633 is positioned above the adhering section 632, and prevents the workpiece from falling to the floor on the off chance that the workpiece separates from the adhering section 632 during rotation.

The hand opening/closing unit 634 opens and closes the hand portion 631, using an actuator. FIG. 5 shows a state in which the hand portion 631 is opened. When the hand portion 631 is opened, the workpiece can pass within the hand portion 631 in the Z-axis direction. Therefore, the workpiece can be arranged at a height between the adhering section 632 and the claw portion 633. The hand opening/closing unit 634 causes the hand portion 631 to be in the closed state by moving the hand portion 631 in the Y-axis direction.

Figure 6:
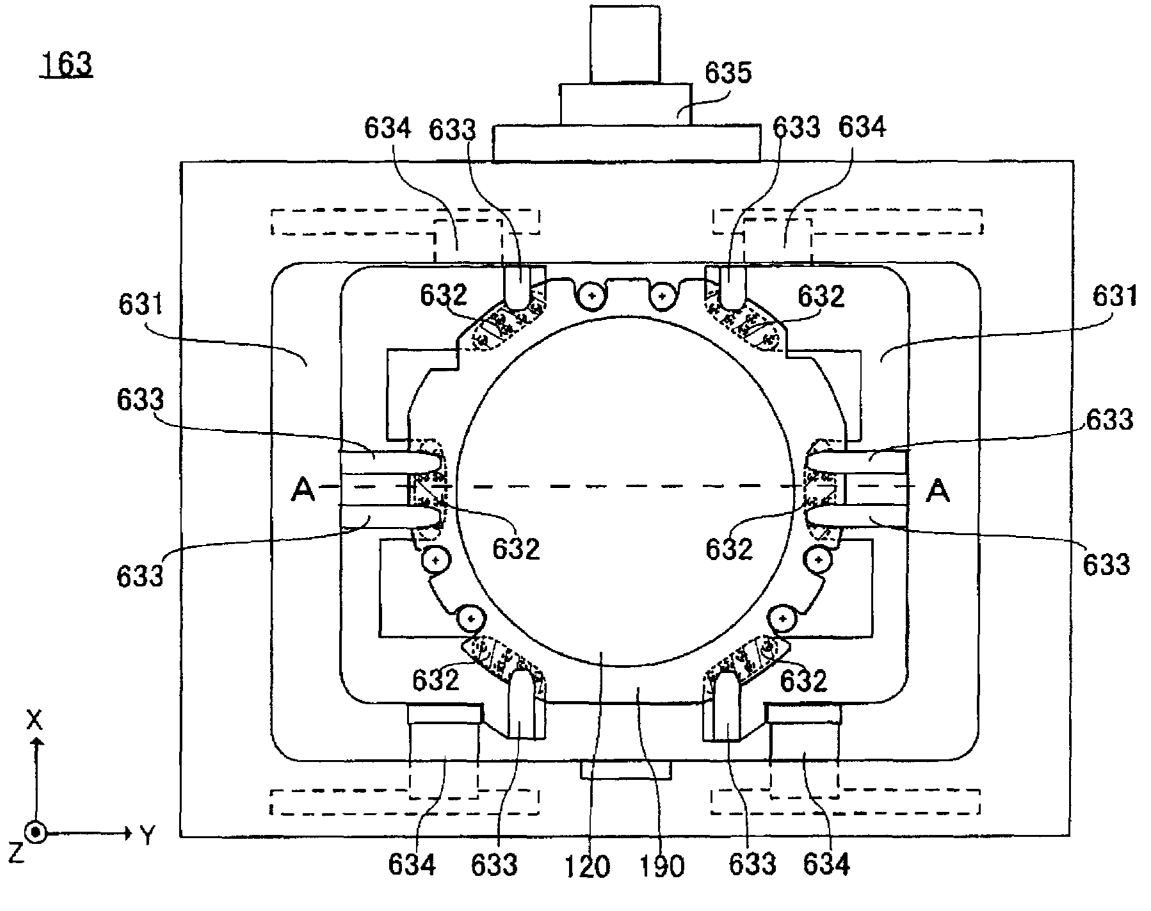
FIG. 6 is a planar view schematically showing the rotational support member when a hand portion is closed.

FIG. 6 is a planar view schematically showing the rotational support member 163 when the hand portion 631 is in the closed state. When the hand portion 631 is closed while the workpiece is at a height between the adhering section 632 and the claw portion 633, the edge of the workpiece is arranged at a position sandwiched between the adhering section 632 and the claw portion 633. In this state, the support pins 161 are lowered to mount the workpiece on the adhering section 632.

Figure 7:
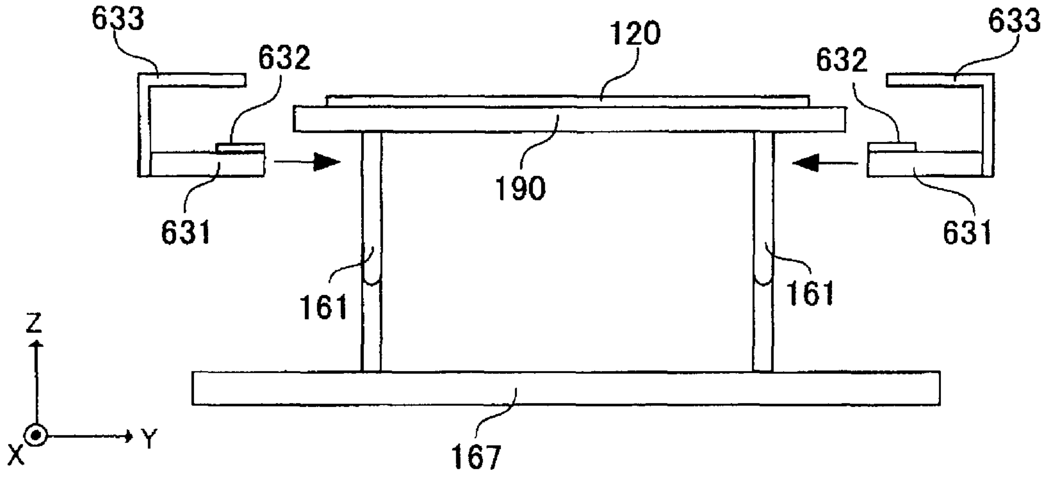
FIG. 7 is a planar view schematically showing operation of the rotational support member.

The following describes the flow from receiving the workpiece from the first transport unit 181 or the second transport unit 182 to inverting the workpiece. FIG. 7 is a cross-sectional view showing operation of the rotational support member 163. Specifically, FIG. 7 is a cross-sectional view of a state in which the workpiece is lowered by the Z-driving section 162 to be at a height between the adhering section 632 and the claw portion 633. In particular, FIG. 7 is a cross-sectional view over the line A-A shown in FIG. 6. In this state, the hand opening/closing unit 634 moves the hand portion 631 in the Y-axis direction.

Figure 8:
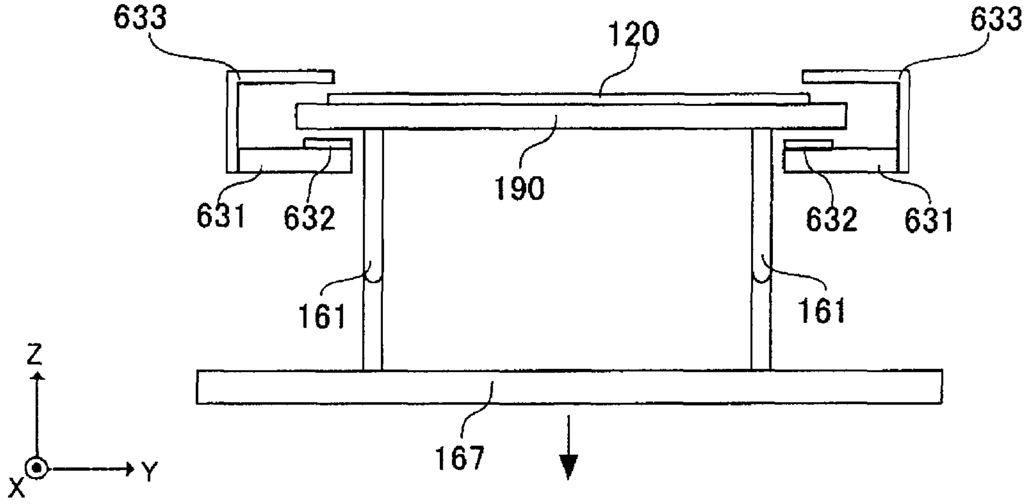
FIG. 8 is a planar view schematically showing operation of the rotational support member.

FIG. 8 is a cross-sectional view showing the following operation of the rotational support member 163. Specifically, FIG. 8 is a cross-sectional view of a state in which the hand portion 631 is closed and the adhering section 632 and claw portion 633 are positioned to sandwich the workpiece. The edge of the workpiece is positioned directly above the adhering section 632. The support pins 161 are lowered by lowering the bottom plate 167.

Figure 9:
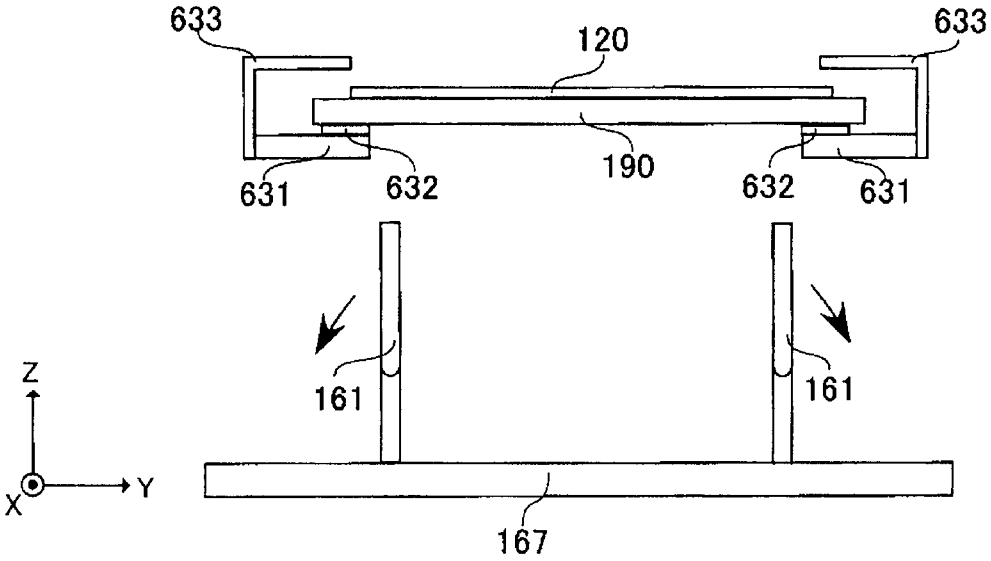
FIG. 9 is a planar view schematically showing operation of the rotational support member.

FIG. 9 is a cross-sectional view showing the following operation of the rotational support member 163. Specifically, FIG. 9 shows a state in which the support pins 161 are lowered to mount the workpiece on the adhering section 632. In this state, the adhering section 632 operates to exert vacuum suction on the workpiece. The rotational driving unit 635 operates to rotate the workpiece, but when the workpiece is rotated in this state, the workpiece contacts the support pins 161. Therefore the support pins 161 are withdrawn so as not to contact the workpiece.

This contact can be avoided by lowering the support pins 161 to be outside the empty region in which the workpiece rotates. However, a certain time is needed to lower the support pins 161 to this position, and this decreases the overall throughput of the aligning apparatus 100. Furthermore, a certain amount of space is necessary to lower the support pins 161 to this position, and therefore the size of the inverting mechanism 160 is increased and the space cannot be effectively used.

Therefore, in the present embodiment, the support pins 161 are inclined in a direction to withdraw from the empty region in which the workpiece rotates. Specifically, the support pins 161 each include a joint and a drive motor, and the support pin 161 can be inclined from the joint by the drive of the drive motor.

Figure 10:
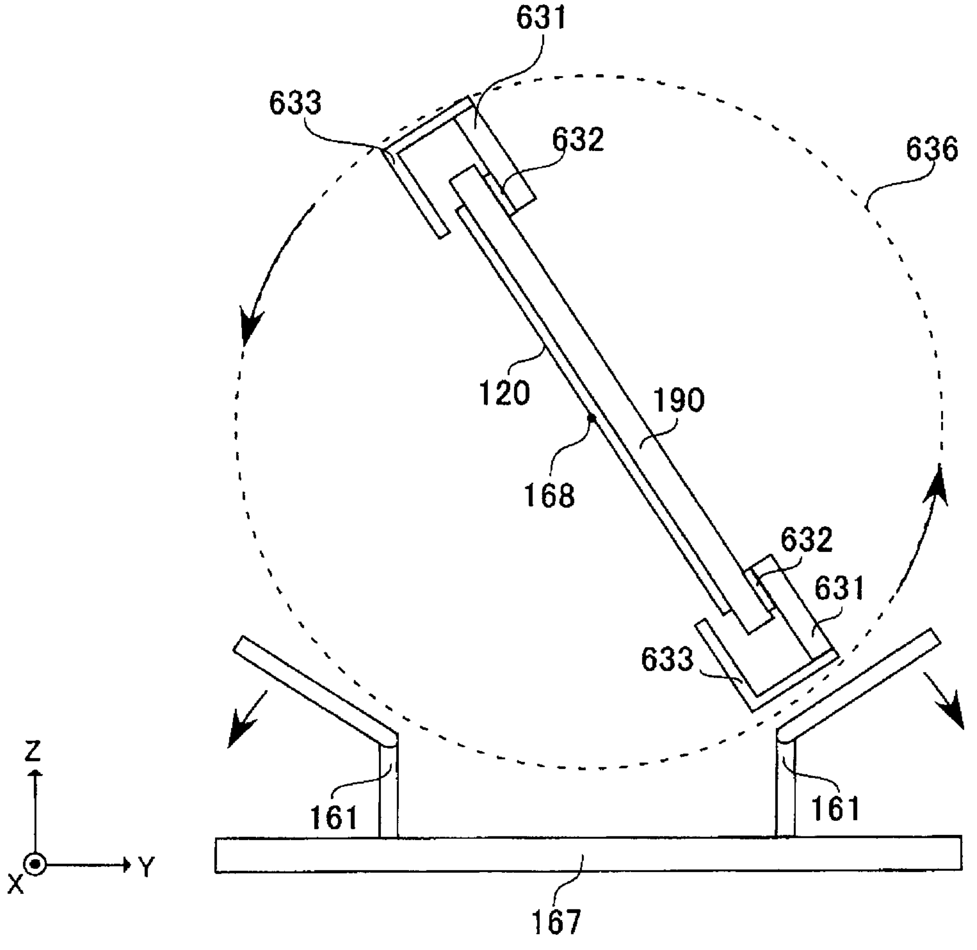
FIG. 10 is a planar view schematically showing operation of the rotational support member.

FIG. 10 is a cross-sectional view showing the following operation of the rotational support member 163. Specifically, FIG. 10 shows a state in which the support pins 161 are inclined and the workpiece is rotated. The rotational support member 163 rotates the workpiece on a rotational axis that is the centerline 169, which matches the centerline of the substrates 120 forming the workpiece. With this configuration, the surfaces of the substrates 120 can be kept at the same position in the Z-direction before and after the inversion.

The empty region 636 shown by the dotted line is the empty region in which the workpiece rotates. As described above, by forming the support pins 161 to be inclined in a direction to withdraw from the empty region 636, the support pins 161 can be lowered and withdrawn from the empty region 636 more quickly, thereby increasing the processing speed. Furthermore, since there is no need of a space into which the support pins 161 are lowered, the space can be used effectively.

Prior to the inclination, the support pins 161 may be configured to withdraw to a position that more reliably avoids contact, by withdrawing the workpiece a prescribed amount in the downward direction. Furthermore, a configuration may be used in which support pins 161 are inclined while also being withdrawn downward, thereby withdrawing from the empty region in which the substrate holder 190 rotates in a shorter time. In the present embodiment, the support pins 161 are provided with joints and incline from the joints, but other inclination methods, such as inclining the entirety of each support pin 161, may be used as long as the support pins 161 are withdrawn from the empty region 636.

Figure 11:
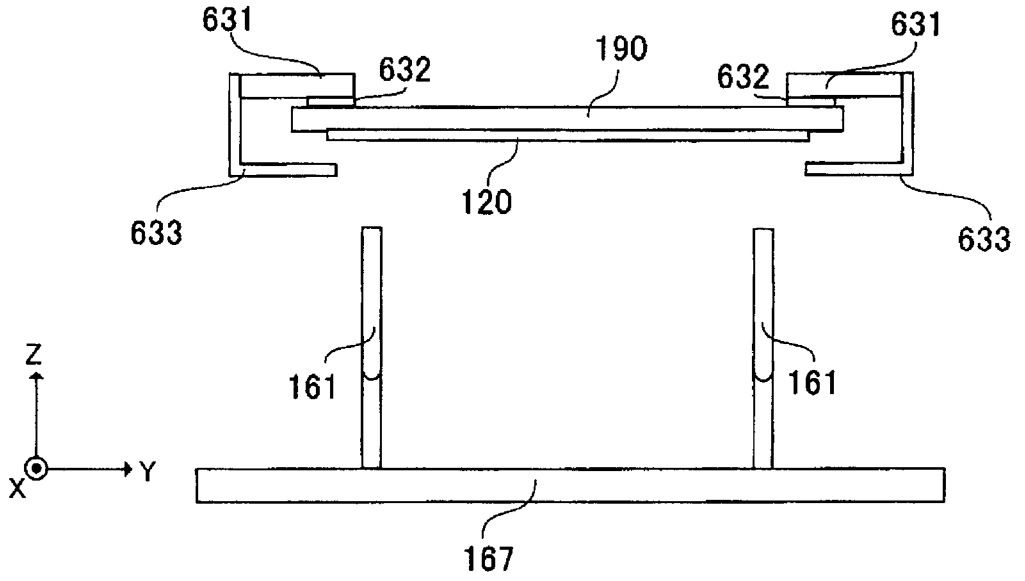
FIG. 11 is a planar view schematically showing operation of the rotational support member.

FIG. 11 is a cross-sectional view showing the following operation of the rotational support member 163. More specifically, FIG. 11 shows a state in which the support pins 161 have returned to a straight state from the inclined state, after rotation of the workpiece is finished. Here, even on the off chance that the workpiece is separated form the adhering section 632, the workpiece is still held by the claw portion 633 and can therefore be prevented from falling to the floor. In this state, the support pins 161 are again raised to contact the workpiece, after which the vacuum suction of the adhering section 632 is released.

Figure 12:
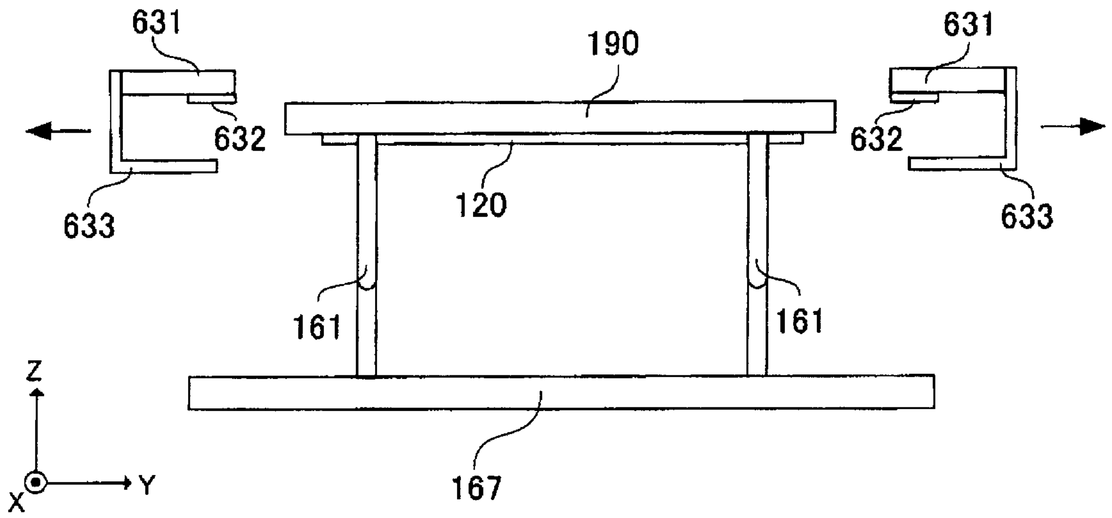
FIG. 12 is a planar view schematically showing operation of the rotational support member.

FIG. 12 is a cross-sectional view showing the following operation of the rotational support member 163. Specifically, FIG. 12 is a cross-sectional view of a state in which the hand opening/closing unit 634 has opened the hand portion 631. In this state, the support pins 161 raise the workpiece using the drive from the Z-driving section 162, and the workpiece is transported by the first transport unit 181 or the second transport unit 182.

When the workpiece is received from the first transport unit 181 or the second transport unit 182 and arranged at a height between the adhering section 632 and the claw portion 633, if the horizontalness of the workpiece detected by the gap sensor 165 is not 0, the rotation amount of the workpiece is adjusted based on the detected horizontalness.

For example, when the detected horizontalness is 1, the rotational driving unit 635 rotates the hand portion 631 in advance 1 degree, and then the hand opening/closing unit 634 drives the hand portion 631. With this control, the workpiece can be held horizontally with the hand portion 631. Since the workpiece is held after being rotated 1 degree, the rotation amount is set as 179 degrees instead of 180 degrees. With this configuration, the workpiece can be set to be horizontal after rotation.

After the workpiece has been transported by the first transport unit 181 or the second transport unit 182, the inverting mechanism 160 stands by in this state without returning the rotational support member 163 to the original state. The rotated workpiece of another workpiece is received, rotated in a direction opposite the previous direction, and passed along to the transport mechanism 180. As a result of this control, the drive amount is less than in a case where the rotational support member 163 is returned to the original state every time, the dust generated by the drive is restricted, and degradation of the driving section can be suppressed.

In this case, the adhering section 632 is arranged above and the claw portion 633 is arranged below. Therefore, when the workpiece is positioned between the adhering section 632 and the claw portion 633, control can be performed to close the hand portion 631, lift the workpiece via the support pins 161 to press against the adhering section 632, and generate the vacuum suction.

Figure 13:
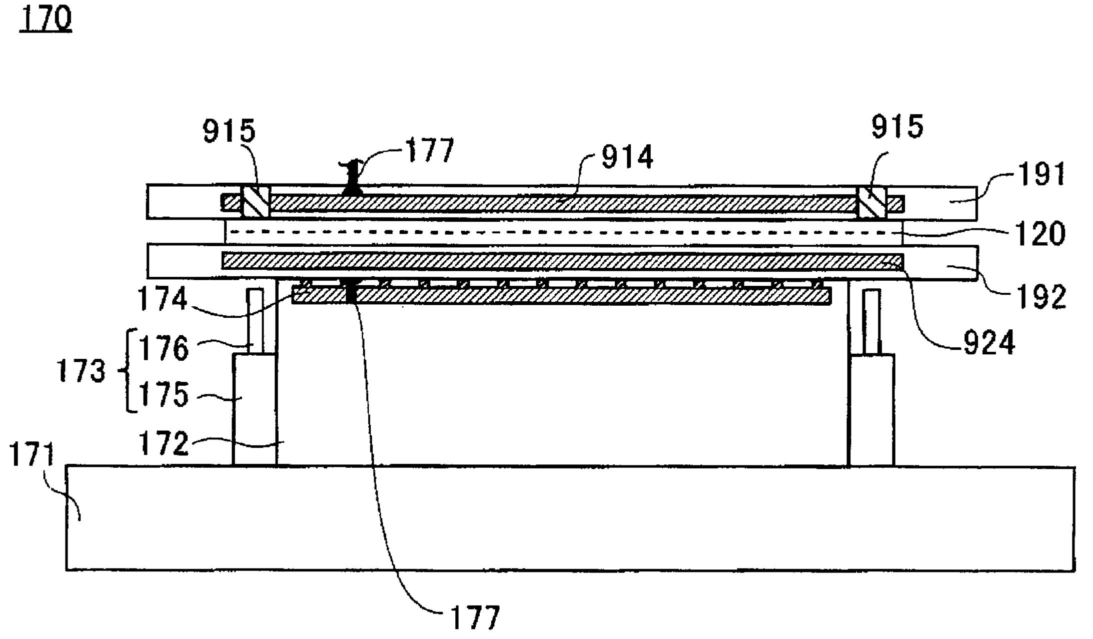
FIG. 13 is a cross-sectional view schematically showing operation and a configuration of a separation mechanism.

FIG. 13 is a cross-sectional view schematically showing the configuration and operation of the separation mechanism 170. The separation mechanism 170 includes a bottom plate 171, a table 172 arranged on the bottom plate 171, a Z-driving section 173, and a power supply line 177. The table 172 includes a vacuum chuck 174 that fixes the lower substrate holder 192 to the top surface thereof via adhesion. FIG. 13 shows a state in which the vacuum chuck 174 operates to adhere the lower substrate holder 192 thereto via vacuum suction. The Z-driving section 173 includes a lift-up pin 176 and an actuator 175 arranged along the side surface of the table 172. The actuator 175 raises and lowers the lift-up pin 176 vertically. The pressing surface of the lift-up pin 176 may be circular, or may be a rectangular or elliptical shape extending in the circumferential direction of the upper substrate holder 191.

The upper substrate holder 191 and lower substrate holder 192 sandwiching the bonded substrates 120 are mounted on the table 172. The mounting surface of the table 172 has a diameter that is less than the diameter of the upper substrate holder 191 and the lower substrate holder 192. Therefore, the outer circumferential portions of the upper substrate holder 191 and the lower substrate holder 192 protrude over the sides of the table 172.

The upper substrate holder 191 and the lower substrate holder 192 include electrostatic chucks 914 and 924 that can be independently operated and stopped, as described above. The upper substrate holder 191 and the lower substrate holder 192 receive power from the power supply line 177. FIG. 13 shows a state in which the electrostatic chucks 914 and 924 are operating.

The separation mechanism 170 includes four lift-up pins 176, which are each provided at a position corresponding to a flange portion 915 of the upper substrate holder 191. Therefore, when a lift-up pin 176 is raised, the top end of the lift-up pin 176 contacts a flange portion 915 of the upper substrate holder 191 without contacting the lower substrate holder 192.

Figure 14:
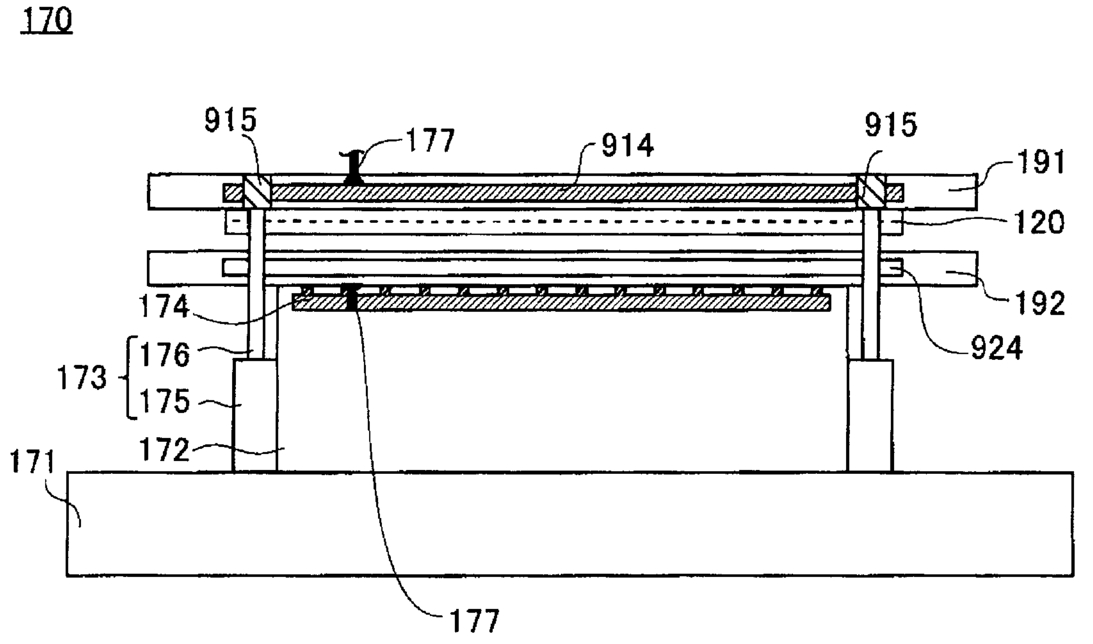
FIG. 14 is a cross-sectional view schematically showing operation of a separation mechanism.

FIG. 14 is a cross-sectional view schematically showing operation of the separation mechanism 170. When the upper substrate holder 191 and the lower substrate holder 192 sandwiching the bonded substrates 120 are mounted on the table 172, the vacuum chuck 174 is operated to adhere the lower substrate holder 192 to the table 172 via vacuum suction. After the electrostatic chuck 924 of the lower substrate holder 192 is stopped, the lift-up pins 176 are raised by the actuators 175. As a result, the top end of each lift-up pin 176 finally contacts a flange portion 915 of the upper substrate holder 191. In the drawings, the presence of a diagonal line pattern indicates that the electrostatic chucks 914 and 924 are in the operational state, and the lack of such a pattern indicates that the electrostatic chucks 914 and 924 have been stopped.

At this time, the lower substrate holder 192 is fixed to the table 172 by vacuum suction. Furthermore, the substrate 120 is maintained in a state of tight adhesion with the upper substrate holder 191. Accordingly, when the lift-up pins 176 are further raised by the actuators 175, the upper substrate holder 191 is lifted up along with the substrate 120, and the substrate 120 is separated from the lower substrate holder 192.

With this configuration, even when portions of the substrate 120 and the lower substrate holder 192 are stuck together due to thermocompression being performed while dust is trapped therebetween, this sticking can be dissolved. When the sticking caused by the thermocompression is dissolved, even when a substrate 120 is again loaded on the lower substrate holder 192, the substrate 120 can again be easily lifted from the lower substrate holder 192. When the electrostatic chuck of the lower substrate holder 192 is stopped, there are cases where the electrostatic adhesion does not completely dissipate, and therefore it is preferable that the lifting of the lift-up pins 176 be performed after a short time has passed.

Furthermore, the upper substrate holder 191 and the substrate 120 are lowered by lowering the lift-up pins 176 using the actuators 175. Next, in the same manner as for the upper substrate holder 191, the substrate 120 is separated. Specifically, first, the electrostatic chuck 924 is changes from the non-operational state to the operational state, while the electrostatic chuck 914 is set to the non-operational state. As a result, the substrate 120 that had been separated is again adhered firmly to the lower substrate holder 192.

The sticking between the substrate 120 and the lower substrate holder 192 due to the thermocompression by the thermocompression apparatus 240 has already been dissolved, and therefore stopping the operation of the electrostatic chuck 924 of the lower substrate holder 192 enables the adhesion exerted on the substrate 120 by the lower substrate holder 192 to be reliably dissolved.

By once more using the actuators 175 to raise the lift-up pins 176 while maintaining the adhesion by the electrostatic chuck 924, the upper substrate holder 191 is raised again. At this time, the substrate 120 is adhered to the lower substrate holder 192 by electrostatic adhesion, and therefore the upper substrate holder 191 rises to be separated from the substrate 120.

In this state, the upper substrate holder 191 is transported out of the separation mechanism 170 by the robot arm 186, and mounted on the push-pin of the first handover port 183. The actuators 175 are then operated to lower the lift-up pins 176 and the vacuum chuck 174 is stopped, thereby dissolving the vacuum suction. After this, the lower substrate holder 192 holding the bonded substrate 120 is transported out of the separation mechanism 170 by the robot arm 186, and mounted on the push-pin of the first handover port 183. The temporal order of the separation from the upper substrate holder 191 and the separation from the lower substrate holder 192 may be the opposite of the order described above.

The lower substrate holder 192 and the substrate 120 mounted on the push-pin of the first handover port 183 are held by the second transport unit 182, and transported to the hold table 132 of the preliminary aligner 130. After this, the robot arm 116 of the EFEM 112 holds the bonded substrate 120 and transports the substrate 120 into the FOUP provided to the loading port 115. As a result of the above flow, a bonded substrate is manufactured by stacking two substrates 120 having circuit patterns formed thereon.

Figure 15:
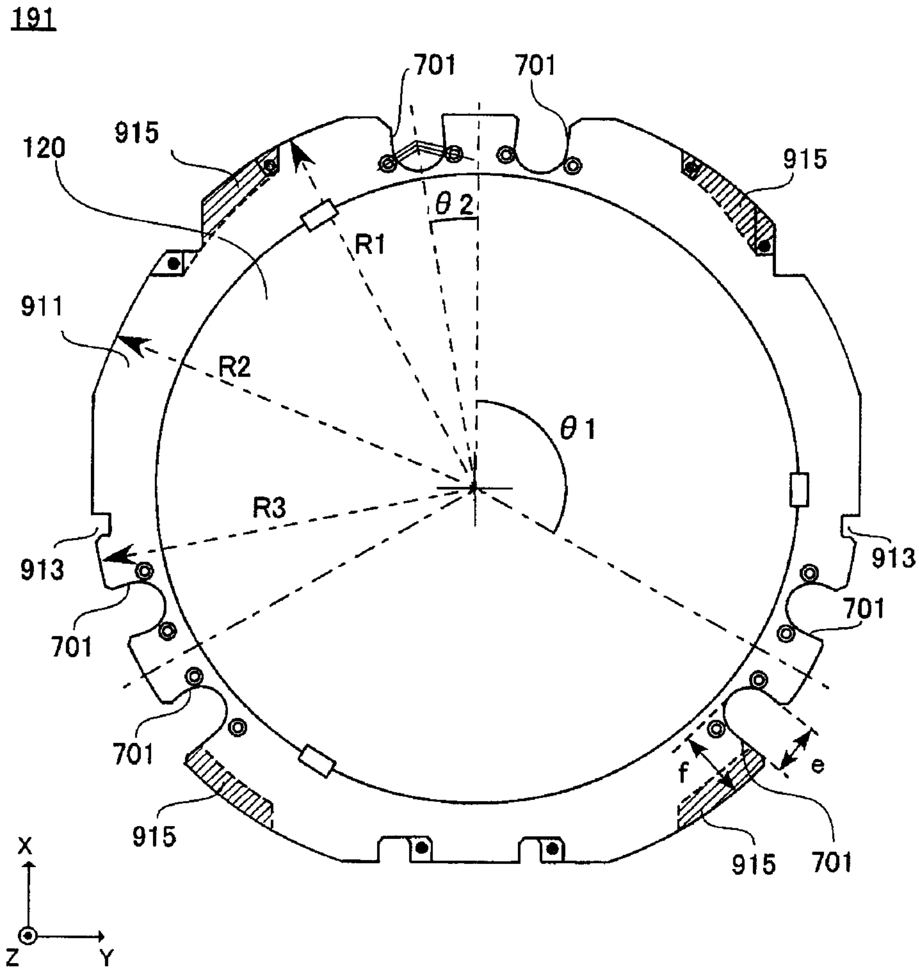
FIG. 15 is a planar view schematically showing a configuration of another upper substrate holder.

FIG. 15 is another example of an upper substrate holder 191. Portions of the configuration of the upper substrate holder 191 in FIG. 15 that are the same as those of the upper substrate holder 191 of FIG. 2 are given the same reference numerals. Furthermore, in order to show an external form, FIG. 15 does not show the magnet units 912.

The upper substrate holder 191 of FIG. 15 is used for a wafer with a diameter of 300 mm. The holder body 911 includes a portion with a large radius R1, a portion with a medium radius R2, and a portion with a small radius R3. The portion with the large radius R1 includes flange portions 915 that receive the pressing force of the lift-up pins 176. The radius R1 may be 185 mm, the radius R2 may be 180 mm, and the radius R3 may be 175 mm, for example. In the same manner as the upper substrate holder 191 in FIG. 2, the outer shape of the upper substrate holder 191 of FIG. 15 also includes linear portions in the X-direction and Y-direction, and the distance between opposite parallel linear portions may be 350 mm, for example.

There are three sets of housing portions 701 housing the magnet units, and each set includes two housing portions 701. The interval θ1 in the circumferential direction between each set may be 120 degrees, for example. Furthermore, θ2, which is half of the circumferential interval between the two housing portions 701 in each set, may be from 0.5 degrees to 20 degrees, for example, and is preferably 10 degrees. The size of each housing portion 701 is greater than the size of each magnet unit, and may have a width e from 10 mm to 30 mm, preferably 24 mm. The depth f from the external edge of each housing portion 701 is from 10 mm to 40 mm, and is from approximately 5% to 25% of the large radius R1.

Figure 16:
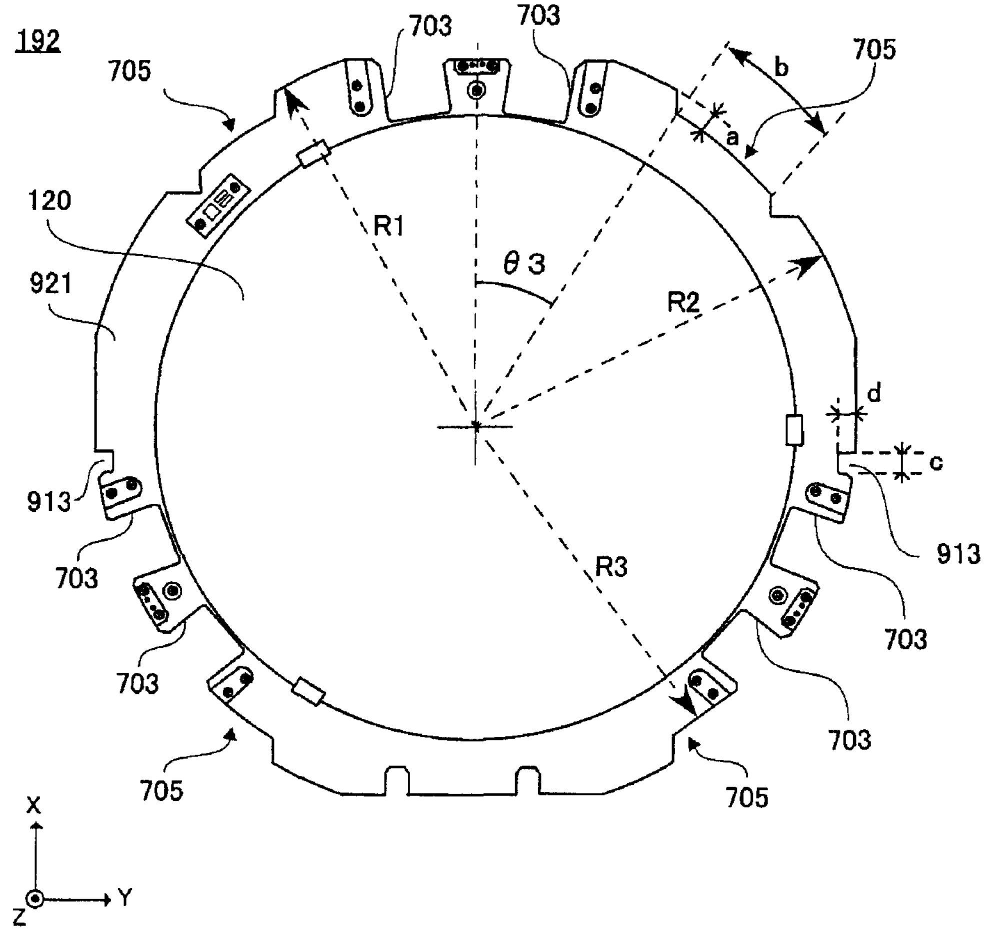
FIG. 16 is a planar view schematically showing a configuration of another lower substrate holder.

FIG. 16 is another example of the lower substrate holder 192. Portions of the configuration of the lower substrate holder 192 in FIG. 16 that are the same as those of the lower substrate holder 192 of FIG. 3 are given the same reference numerals. Furthermore, in order to show an external form, FIG. 16 does not show the adhering units 922.

The lower substrate holder 192 of FIG. 16 forms a pair with the upper substrate holder 191 of FIG. 15. The holder body 921 includes a portion with a large radius R1, a portion with a medium radius R2, and a portion with a small radius R3. The portion with the small radius R3 includes notches 705. The notches 705 are portions that expose the flange portions 915 when stacked on the upper substrate holder 191. As a result, the flange portions 915 can be pressed by the lift-up pins 176. The radius R1 may be 185 mm, the radius R2 may be 180 mm, and the radius R3 may be 175 mm, for example. In the same manner as the lower substrate holder 192 in FIG. 3, the outer shape of the lower substrate holder 192 of FIG. 16 also includes linear portions in the X-direction and Y-direction, and the distance between opposite parallel linear portions is 350 mm.

Housing portions 703 that house adhesion elements are provided at positions corresponding to the housing portions 701 of the magnet units. The size of the housing portions 703 depends on the size of the adhesion elements, but the width of each housing portion 703 is greater than the width e of each housing portion 701, and is preferably 30 mm.

The size of the notches 705 depends on the size of the lift-up pins 176. Here, larger area of the pressing surface of a lift-up pin 176 causes larger pressing force, but in a case where the pressing surface of a lift-up pin 176 is shaped to extend in the circumferential direction, the surface area thereof may be increased by further extension in the circumferential direction. In accordance with this extension, the notch 705 may also be extended in the circumferential direction, thereby restricting the size increase of the lower substrate holder 192. The specific shape of each notch 705 may be such that the depth from the outer edge thereof is from 5 mm to 40 mm, and from 3% to 25% of the large radius R1, preferably 10 mm, i.e. 5.4%. The length of each notch 705 in the circumferential direction is from 10 mm to 50 mm, preferably 43 mm. Furthermore, the position of each notch 705 in the circumferential direction, as shown by the starting point of a central line of a set of housing portions 703, is preferably from 10 degrees to 50 degrees from the central line.

The size of each notch 913 depends on the size of the field of vision of the observing unit 187, and may have a width c from 5 mm to 20 mm, for example, preferably 10 mm. Furthermore, the depth from the outer edge of the notch 913 is from 5 mm to 30 mm, preferably 8 mm.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A device comprising:

a first substrate holder;

a second substrate holder, wherein a first substrate bonded to a second substrate are held between the first substrate holder and the second substrate holder;

a holding section included in at least one of the first substrate holder and the second substrate holder that holds via adhesion one of the first substrate and the second substrate;

a pressure receiving portion included proximate the holding section in the first substrate holder that receives a force causing separation of the first substrate holder from the second substrate holder; and a control section that delivers force to the pressure receiving portion via a pressing member when the adhesion to the one of the first substrate and the second substrate is deactivated.

2. The device according to claim 1, further comprising:

a passing portion included in the second substrate holder which allows a pressing member to press the pressure receiving portion to deliver the force.

3. The device according to claim 2, wherein the second substrate holder includes a second holding portion for holding the second substrate, and the passing portion is formed in a portion other than the second holding portion.

4. The device according to claim 2, wherein the pressure receiving portion of the first substrate holder has a greater radius than a the passing portion of the second substrate holder.

5. The device according to claim 2, wherein the radius of the first substrate holder at the pressure receiving portion differs from the radius of the second substrate holder at the passing portion.

6. The device according to claim 2, wherein the passing portion is a notch formed in an outer circumferential portion of the second substrate holder.

7. The device according to claim 6, wherein the second substrate holder has a circular shape, and the notch extends in a circumferential direction of the second substrate holder.

8. The device according to claim 7, wherein the notch extends in the circumferential direction by a length that is from 6% to 27% of a radius of the circular shape, and extends in a radial direction by a length that is from 3% to 25% of the radius of the circular shape.

9. The device according to claim 1, wherein the first substrate holder includes a first holding portion for holding the first substrate, and the pressure receiving portion is provided in a portion of the first substrate holder other than the first holding portion.

10. The device according to claim 1, further comprising:

a bonding section that bonds the first substrate to the second substrate; and a separating section that separates the bonded first substrate and second substrate from both the first substrate holder and the second substrate holder.

11. The device according to claim 10, further comprising:

a preliminary aligner that aligns the first substrate with respect to a first reference portion provided on the first substrate holder and aligns the second substrate with respect to a second reference portion provided on the second substrate holder;

a transport mechanism that transports the first substrate holder holding the first substrate aligned by the preliminary aligner and the second substrate holder holding the second substrate aligned by the preliminary aligner from the preliminary aligner; and an observing unit that observes the first and second reference portions of the first substrate holder and the second substrate holder during the transport by the transport mechanism.

12. The device according to claim 11, further comprising an aligner that aligns and stacks the first substrate held by the first substrate holder and the second substrate held by the second substrate holder based on a skew amount between the reference portions according to the preliminary aligner and the observation by the observing unit;

wherein a transport path of the transport mechanism includes at least a portion of a path from the preliminary aligner to the aligner.

13. The device according to claim 12, wherein the aligner includes:

a first stage on which is loaded the first substrate holder;

a second stage that moves relative to the first stage and on which is loaded the second substrate holder; and a control section that corrects a target position of one of the first stage and the second stage based on the skew amount.

14. The device according to claim 12, further comprising an inverting mechanism that inverts an orientation of one of the first substrate holder and the second substrate holder, between the preliminary aligner and the aligner, wherein the observing unit is arranged between the inverting mechanism and the aligner.

15. The device according to claim 11, wherein an image capturing field of view of the observing unit is narrower than an image capturing field of view of the preliminary aligner.

16. The device according to claim 11, wherein each reference portion is a notch formed in an outer circumferential portion of each of the first substrate holder and the second substrate holder.

17. The device according to claim 16, wherein each notch is machined to have a tip that is thinner than the substrate holders.

18. A substrate holder comprising:

a holding portion that holds via adhesion one of a first substrate and a second substrate bonded to the first substrate;

a passing portion included proximate the holding portion that allows a pressing member to pass therethrough to enable pressing of a complimentary substrate holder by the pressing member; and a control section that delivers force to the complimentary substrate holder via the pressing member when the adhesion to the one of the first substrate and the second substrate is deactivated.

19. The substrate holder according to claim 18, wherein the passing portion is formed in a portion other than the holding portion.

20. The substrate holder according to claim 18, further comprising an outer circumferential portion, wherein the passing portion is a notch formed in the outer circumferential portion.

21. The substrate holder according to claim 20, wherein the outer circumferential portion has a circular shape, and the notch extends in a circumferential direction of the circumferential portion.

22. The substrate holder according to claim 21, wherein the notch extends in the circumferential direction by a length that is from 6% to 27% of a radius of the circular shape, and extends in a radial direction by a length that is from 3% to 25% of the radius of the circular shape.

23. A substrate holder comprising a holding section that holds via adhesion one of a first substrate and a second substrate bonded to the first substrate;

a pressure receiving portion proximate the holding section that receives a force in a direction causing movement away from a complimentary substrate holder; and a control section that delivers force to the pressure receiving portion via a pressing member when the adhesion to the one of the first substrate and the second substrate is deactivated.

24. A method comprising:

bonding a first substrate held by a first holding portion of a first substrate holder via adhesion to a second substrate held by a second holding portion of a second substrate holder via adhesion;

deactivating the adhesion to the first substrate;

delivering force to a pressure receiving portion of a first substrate holder via a pressing member when the adhesion to the first substrate is deactivated, the pressure receiving portion proximate the first holding portion; and separating the bonded first substrate and second substrate from the first substrate holder.

25. The method according to claim 24, further comprising:

aligning, with a preliminary aligner, the first substrate with respect to a first reference portion provided on the first substrate holder and the second substrate with respect to a second reference portion provided on the second substrate holder;

transporting the first substrate holder holding the aligned first substrate and the second substrate holder holding the aligned second substrate from the preliminary aligner; and observing the first and second reference portions of the first substrate holder and the second substrate holder during the transport.

26. The method according to claim 25, further comprising aligning with an aligner, the first substrate held by the first substrate holder and the second substrate held by the second substrate holder; and stacking the first substrate on the second substrate based on a skew amount between positions of the reference portions according to the preliminary aligner and the observed positions of the reference portions;

wherein a path used for the transportation includes at least a portion of a path from the preliminary aligner to the aligner.

27. The method according to claim 26, wherein the stacking includes correcting a target position of a movable stage, on which is mounted one of the first substrate holder and the second substrate holder, based on the skew amount.

28. The method according to claim 26, further comprising inverting an orientation of one of the first substrate holder and the second substrate holder, at a point in time between the preliminary alignment and the stacking, wherein the observing takes place at a point in time between the inverting and the stacking.

29. The manufacturing method according to claim 24, wherein the separating includes pressing a pressure receiving portion of a first substrate with a pressing member.

30. The manufacturing method according to claim 29, wherein the pressing is performed once an electrostatic adhesion of the holding member has dissipated.

31. The manufacturing method according to claim 29, wherein the separating further includes:

retracting the pressing member;

holding the first substrate with the first substrate holder;

releasing the second substrate from the second substrate holder; and pressing the pressure receiving portion with the pressing member.

* * * * *